US006485591B1

(12) United States Patent
Nakao et al.

(10) Patent No.: US 6,485,591 B1
(45) Date of Patent: Nov. 26, 2002

(54) METHOD FOR MANUFACTURING LAMINATED-CERAMIC ELECTRONIC COMPONENTS

(75) Inventors: Keiichi Nakao, Kyoto (JP); Hideyuki Okinaka, Toyonaka (JP); Yasutaka Horibe, Ikoma (JP); Hikoji Okuyama, Moriguchi (JP); Masahiro Katoh, Hirakata (JP); Takashi Iguchi, Chitose (JP); Akira Ohmi, Chitose (JP); Yoshiyuki Miura, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 08/286,098

(22) Filed: Aug. 4, 1994

Related U.S. Application Data

(63) Continuation of application No. 08/009,431, filed on Jan. 27, 1993, now abandoned, which is a continuation of application No. 07/794,310, filed on Nov. 14, 1991, now abandoned, which is a continuation of application No. 07/444,167, filed as application No. PCT/JP99/00240 on Mar. 7, 1989, now abandoned.

(30) Foreign Application Priority Data

| Mar. 7, 1988 | (JP) | ............................................. 63-52821 |
| Mar. 7, 1988 | (JP) | ............................................. 63-52825 |
| Mar. 7, 1988 | (JP) | ............................................. 63-52835 |
| Mar. 7, 1988 | (JP) | ............................................. 63-52846 |
| Mar. 7, 1988 | (JP) | ............................................. 63-52851 |
| Mar. 7, 1988 | (JP) | ............................................. 63-52860 |
| Apr. 21, 1988 | (JP) | ............................................. 63-98655 |
| Oct. 25, 1988 | (JP) | ............................................. 63-268458 |

(51) Int. Cl.[7] .......................... B32B 31/26; H01G 4/12; H01G 7/10; H01L 41/22

(52) U.S. Cl. ................ 156/89.12; 156/89.16; 156/235; 156/246; 156/247

(58) Field of Search .......................... 156/89, 233, 238, 156/240, 242, 246, 247, 235, 89.12, 89.16; 118/56, 63

(56) References Cited

U.S. PATENT DOCUMENTS

| 2,711,983 A | * | 6/1955 | Hoyt ............................ 156/89 |
| 3,215,575 A | * | 11/1965 | Gobel .......................... 156/89 |
| 3,574,029 A | * | 4/1971 | Ettre ........................ 156/89 X |
| 3,642,551 A | * | 2/1972 | Laconich et al. ............. 156/89 |

(List continued on next page.)

FOREIGN PATENT DOCUMENTS

| GB | 4369776 | 10/1976 |
| JP | 4019975 | 9/1965 |
| JP | 5215879 | 2/1977 |
| JP | 52133553 | 11/1977 |
| JP | 52135050 | 11/1977 |

(List continued on next page.)

Primary Examiner—Curtis Mayes
(74) Attorney, Agent, or Firm—Akin, Gump, Strauss, Hauer & Feld, L.L.P.

(57) ABSTRACT

The invention relates to a method of laminating ceramic greenware sheets with electrodes embedded therein (25) which is formed on a support by pressure-adhering a ceramic greenware sheet with an electrode embedded therein onto a second ceramic greenware sheet or other electrodes (23), then peeling off the support alone and transferring the ceramic greenware sheet with the embedded electrodes onto the second ceramic greenware sheet or the other electrodes. This manufacturing method enables it to laminate ceramic greenware sheets each the thickness of which is as thin as 20 micrometers or less, while maintaining their mechanical strength and embedded electrodes in the ceramic greenware sheets, thereby enabling it to prevent a occurrence of surface irregularities due to the thickness of the electrodes even when laminating to a high degree.

13 Claims, 34 Drawing Sheets

U.S. PATENT DOCUMENTS

| | | | | |
|---|---|---|---|---|
| 3,953,626 A | * | 4/1976 | Suzuki et al. | 264/134 X |
| 4,008,514 A | | 2/1977 | Elderbaum | 29/25.42 |
| 4,050,976 A | * | 9/1977 | Reiters | 156/235 X |
| 4,082,906 A | * | 4/1978 | Amin et al. | 156/89 X |
| 4,254,734 A | * | 3/1981 | Postupack et al. | 118/624 |
| 4,269,929 A | | 5/1981 | Nothnagle | 430/264 |
| 4,383,494 A | * | 5/1983 | Schillke et al. | 118/63 X |
| 4,401,253 A | * | 8/1983 | O'Rourke | 118/63 X |
| 4,540,621 A | * | 9/1985 | Eggerding et al. | 428/209 |
| 4,586,972 A | | 5/1986 | Yokotani et al. | 156/89 |

FOREIGN PATENT DOCUMENTS

| | | |
|---|---|---|
| JP | 52135051 | 11/1977 |
| JP | 5342353 | 4/1978 |
| JP | 5351458 | 5/1978 |
| JP | 55124225 | 9/1980 |
| JP | 5694719 | 7/1981 |
| JP | 56106244 | 8/1981 |
| JP | 57102166 | 6/1982 |
| JP | 59172711 | 9/1984 |
| JP | 6049590 | 11/1985 |
| JP | 61102719 | 5/1986 |
| JP | 6263413 | 3/1987 |
| JP | 6227721 | 6/1987 |
| JP | 6235255 | 7/1987 |
| JP | 6331104 | 2/1988 |
| JP | 6332909 | 2/1988 |
| JP | 6351616 | 3/1988 |
| JP | 6351617 | 3/1988 |
| JP | 6353912 | 3/1988 |

* cited by examiner (A)

(B)

(C)

F I G. 11
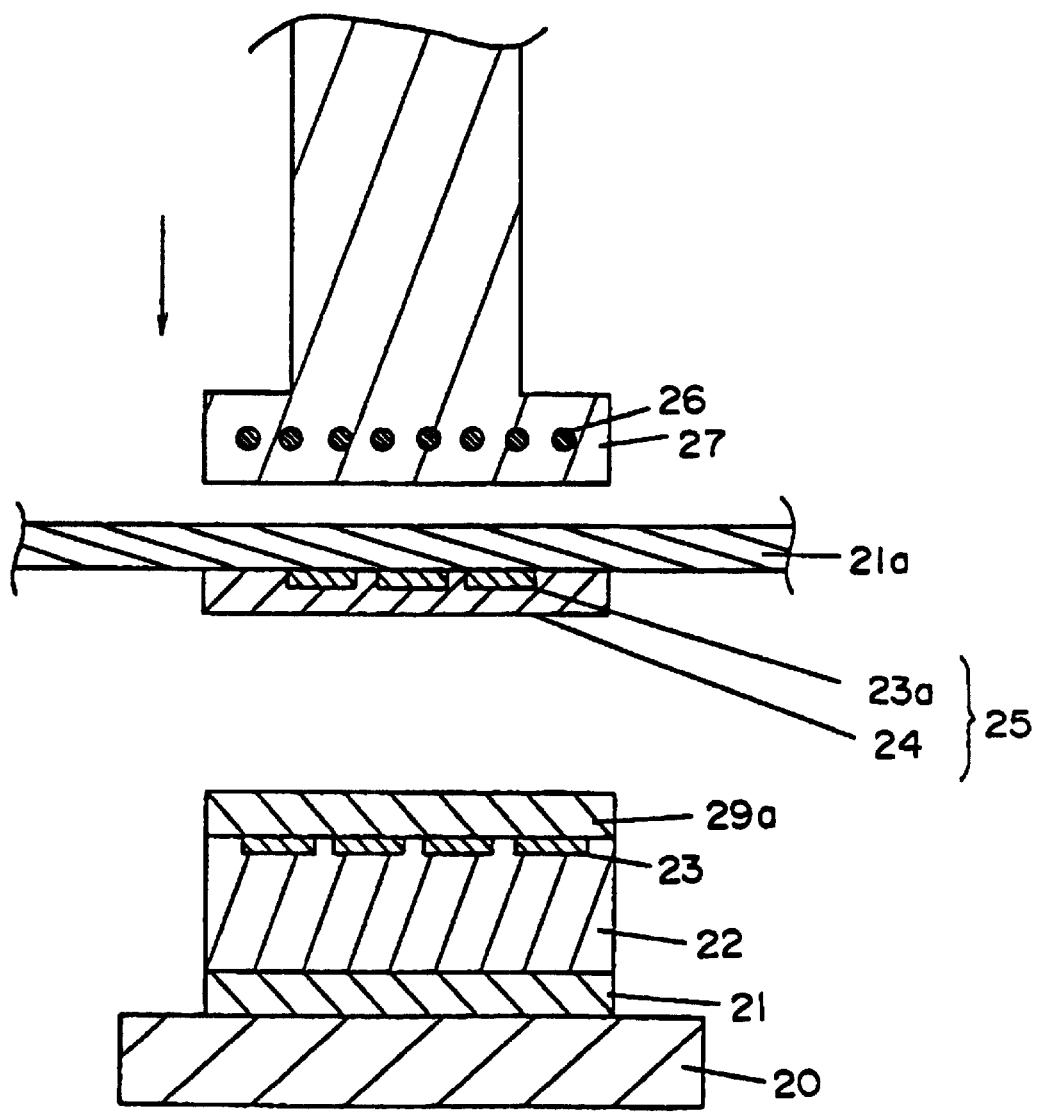

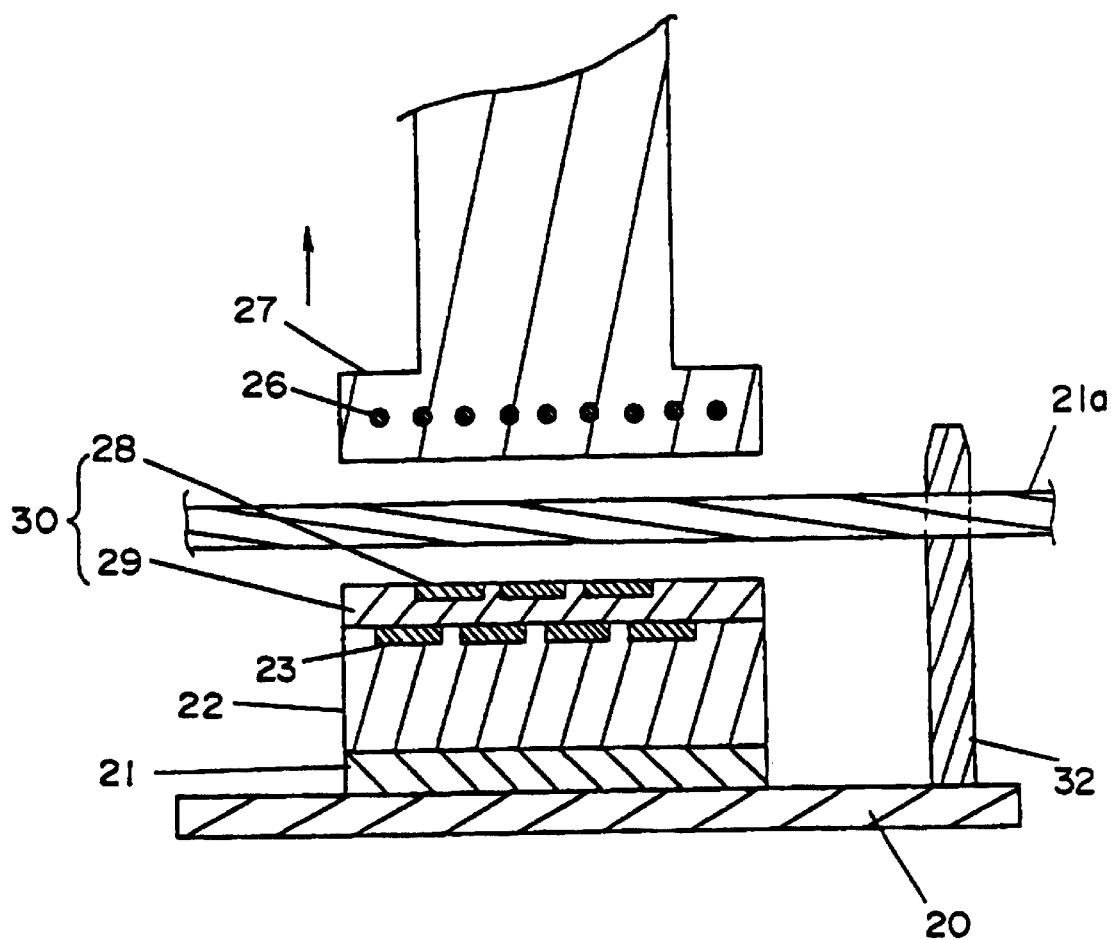
F I G. 14

F I G. 29
(A)
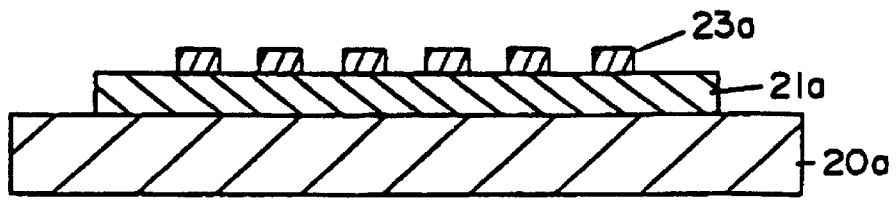
(B)
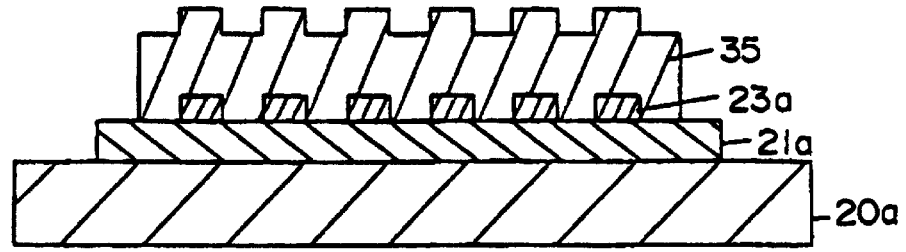
(C)
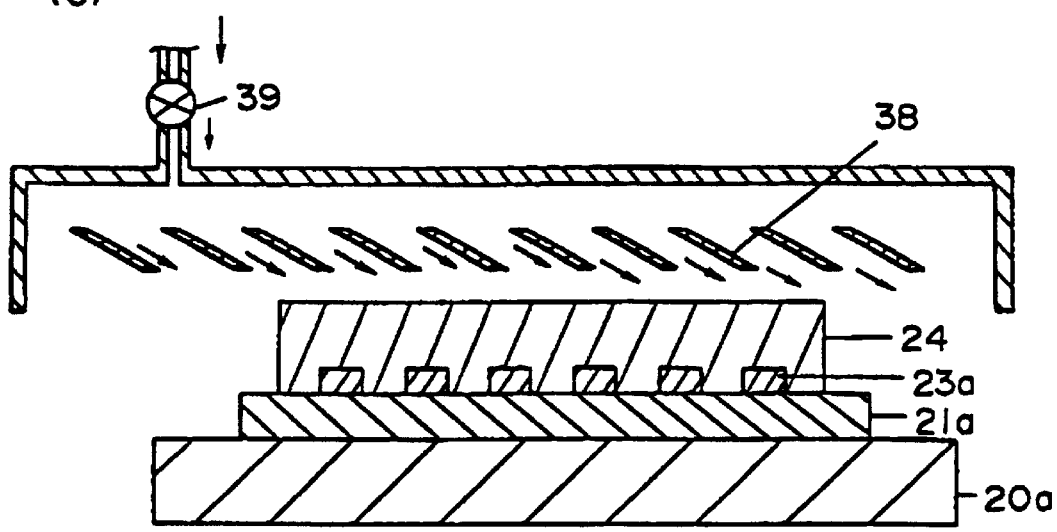
(D)
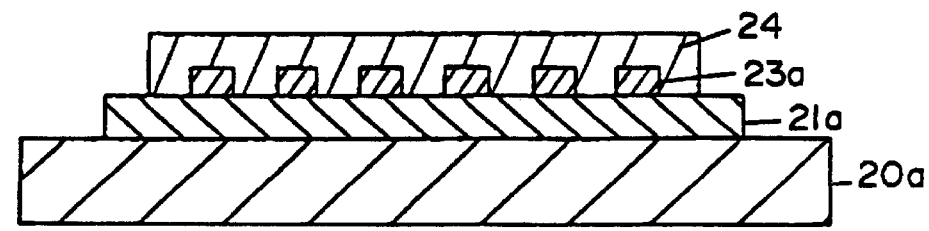

(A)

(B)

F I G. 32
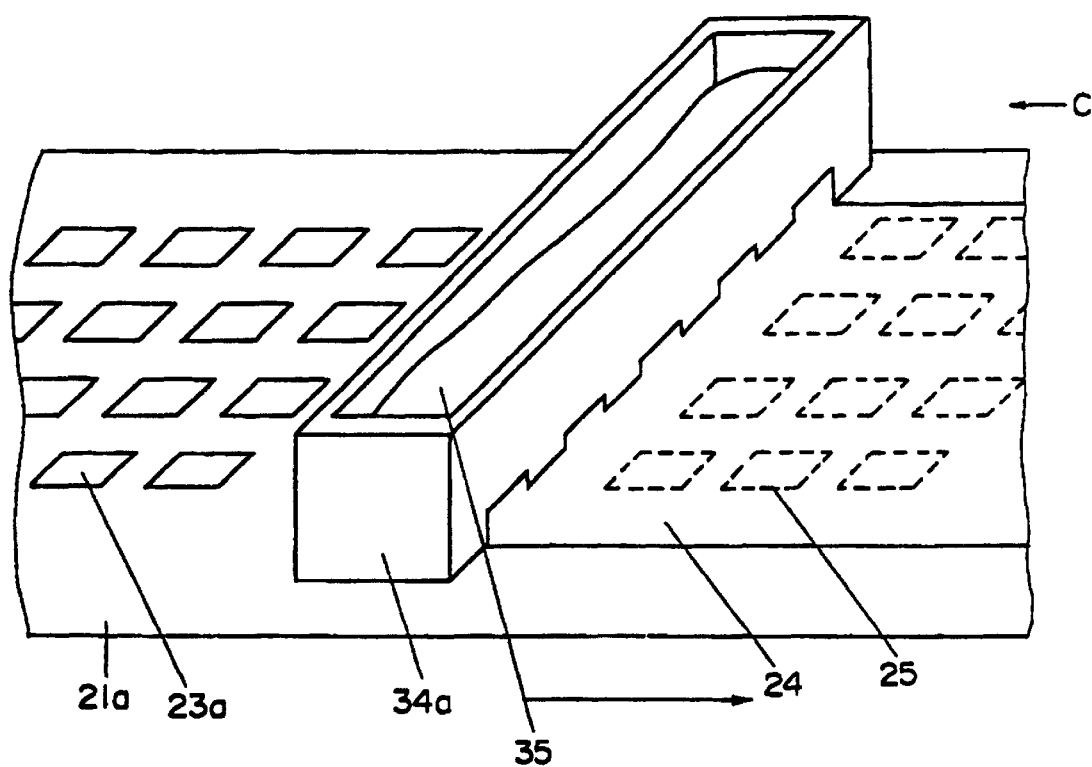

(A)

(B)

(C)

METHOD FOR MANUFACTURING LAMINATED-CERAMIC ELECTRONIC COMPONENTS

This application is a continuation of U.S. application Ser. No. 08/009,431, filed Jan. 27, 1993, now abandoned, which is a continuation of U.S. application Ser. No. 07/794,310, filed Nov. 14, 1991, now abandoned, continuation of U.S. application Ser. No. 07/444,167, filed Dec. 29, 1989, now abandoned.

TECHNICAL FIELD

The present invention relates to a method for manufacturing laminated-ceramic electronic components such as laminated-ceramic capacitors which are widely used in electronic devices such as video tape recorders, liquid crystal display televisions and OA equipment. The invention can also be widely applied to manufacturing of laminated-ceramic electronic components such as multilayer ceramic substrates, laminated varistors and laminated piezoelectric devices.

BACKGROUND ART

In recent years, the trend toward higher density of circuit boards in the field of electronic components has been imposing increasing requirements on laminated-ceramic capacitors and other components for further size reduction and higher performance. A laminated-ceramic capacitor is taken as an example in the following description.

FIG. 1 is a cross sectional view of a part of a laminated-ceramic capacitor. In FIG. 1, the reference numeral 1 is the ceramic layer, 2 is internal electrodes and 3 is external electrodes. The internal electrodes 2 are connected alternately to the two external electrodes 3.

Laminated-ceramic capacitors have been manufactured by such a conventional method as follows.

Specified electrode ink is printed on ceramic greenware sheets which have been cut into a specified size. The electrode ink is dried to form an electrode ink film. Then a specified number of ceramic greenware sheets on which the electrode ink films have been formed are laminated to form a laminated body of ceramic greenware sheets which is then cut into a desired shape and sintered, to which external electrodes are then bonded for completion.

However, a direct printing of the electrode ink on the ceramic greenware sheet has drawbacks such that a solvent included in the electrode ink (solvents such as diethylene glycol monobutyl ether of about 30% by weight is included in the electrode ink available in the market) causes the ceramic greenware sheet to swell and/or corrodes it during the printing of the electrode ink onto the ceramic greenware sheet. In addition, pin holes become more likely to occur in the ceramic greenware sheet as the ceramic greenware sheet becomes thinner, resulting in a short circuit between internal electrodes.

Various approaches have been taken in an attempt to solve these problems.

FIG. 2 is a drawing explanatory of a process for printing electrode ink on the ceramic greenware sheet by means of a screen printing technique. In FIG. 2, the reference numeral 4 is the screen frame, 5 is the screen, 6 is electrode ink, 7 is the squeegee, 8 is the stage, 9 in the base film, 10 is the ceramic greenware sheet and 11 is the printed electrode. The arrow indicates the direction in which the squeegee moves. As shown in FIG. 2, a specified number of ceramic greenware sheets on which the electrode ink is printed are laminated to form a ceramic greenware lamination, which is then cut into a desired shape and then sintered, to which external electrodes are bond ed to make laminated-ceramic capacitors.

In order to increase the capacitance of the laminated-ceramic capacitor, it has been attempted to decrease the thickness of the ceramic layer. In order to decrease the thickness of the ceramic layer, thickness of the ceramic greenware sheet must be decreased. However, a decrease in the thickness of the ceramic greenware sheet leads to the decrease of its mechanical strength. Therefore, there is a problem that a ceramic greenware sheet of a thickness less than 20 micrometers cannot be handled individually (called problem 1 hereafter), which makes a reduction of thickness difficult. Moreover, during a printing of electrode ink onto the ceramic greenware sheet surface, there is a problem that the likeliness of a short circuit occurrence increases with a decrease in the thickness of the ceramic greenware sheet (called problem 2 hereafter), because the ceramic greenware sheet swells or is dissolved by the electrode ink (or by permeation of the electrode ink into minute surface irregularities of the ceramic greenware sheet).

Also, with a laminated-ceramic capacitor, an increase in the number of laminated layers causes local thickness variations or steps on the surface due to the internal electrodes. This problem will be well understood from the following description with reference to FIGS. 3 and 4.

FIG. 3 is a cross sectional view of a laminated-ceramic capacitor formed by multiple layers. As shown in FIG. 3, the thickness of the laminated-ceramic capacitor is greater at the center (where the number of internal electrodes 2 stacked is greater), called thickness A, than at the periphery (where the number of internal electrodes 2 stacked is smaller), called thickness B.

FIG. 4 is a drawing explanatory of the thickness difference between the center and the periphery with respect to the number of laminated layers. The thickness of the ceramic greenware sheet used herein is 20 micrometers, and the thickness of the internal electrode 2 is 4 micrometers. From FIG. 4, it can be seen that a thickness difference between the center and the periphery exceeds 20 micrometers, which is equal to the thickness of the ceramic greenware sheet which is laminated, when the number of laminated layers exceeds 10. Surface irregularities due to this thickness difference (total thickness of electrodes) make it impossible to make uniformly laminated-ceramic capacitors, causing a problem such as delamination (peel-off of layers) and crack (called problem 3 hereafter).

To solve these problems (problems 1, 2 and 3), various approaches have been taken.

Solutions to the problem 1 include a method, proposed in Japanese Laid-Open Patent Publication No. 62-63413, where electrode ink is printed onto the ceramic greenware sheets while the ceramic greenware sheets remain to be adhered onto base films, and they are laminated to make it easy to handle the ceramic greenware sheets. After lamination, the base films are peeled off. This method can solve problem 1 to a certain extent, but cannot solve problem 3. Moreover, with regards to problem 2, the solvent of the electrode ink which is absorbed in one side of the ceramic is greenware sheet cannot evaporate from the opposite side, because the opposite side (on which electrode ink is not printed) of the ceramic greenware sheet is covered by the base film, and remains in the ceramic greenware sheet. Consequently, the electrode ink remains in the ceramic greenware sheet for a longer period of time than in the case of the conventional method, thereby further aggravating the problem that the ceramic greenware sheet becomes susceptible to corrosion by the electrode ink (problem 2).

Another method proposed in Japanese Laid-Open Patent Publication No. 59-172711 is to manufacture laminated-ceramic capacitors by embedding electrodes, which are formed on a base film, in ceramic greenware sheets, laminating the ceramic greenware sheets together with the base films, and sintering them. Although this method solves problems 2 and 3 to a certain extent, problem 1 remains unsolved. This is because the base film must be very thin, namely from 1.5 to 14 micrometers, in order to sinter the laminated-ceramic greenware sheets together with the base films. Moreover, the number of base films to be sintered increases with an increase in the number of laminated layers, which makes delamination more likely to occur. This implies that the base film thickness must be decreased with an increase in the number of laminated layers. Base films of such a small thickness are difficult to handle, weak in mechanical strength and are not practical.

Approaches to solve problem 2 include one which uses transfer of electrodes. In Japanese Laid-Open Patent Publication No. 52-15879, Japanese Laid-Open Patent Publication No. 63-31104 and Japanese Laid-Open Patent Publication No. 63-32909, such methods are proposed that electrode ink films are formed on ceramic greenware sheets while adverse effects of the solvent included in the electrode ink are being prevented by subjecting the ceramic greenware sheet to a thermal transfer process with electrode ink, instead of a printing process, thereby improving a yield of laminated-ceramic capacitors. However, in these methods, ceramic greenware sheets and electrodes are laminated alternately by thermal transfer. This means that, to laminate internal electrodes in 50 layers, at least 100 times of thermal transfer are repeated in all, 50 times or more for lamination of ceramic greenware sheets and 50 times for lamination of electrodes. Also, because the likeliness of an occurrence of pin holes is high with only one layer of ceramic greenware sheet, consecutive transfer of two ceramic greenware sheets may be tried, which results in the number of thermal transfer cycles totaling to 150 or more. Moreover, the heating cycles which one transferred layer has undergone is different from those which another layer has undergone. That is, the layer which was laminated first undergoes about 150 heating cycles which follow, while the last laminated layer undergoes no subsequent heat cycles. In general, ceramic greenware sheets undergo slight thermal deformations every time such a heat cycle is applied. As a result, layers which were thermally transferred earlier undergo more heat cycles and therefore undergo greater thermal deformation than the layers laminated later. This results in deformation or a thickness change of the ceramic greenware sheets, a change in the electrode surface area or a disagreement of the position of laminated electrodes, likely causing an occurrence of defects during a cutting-off process after lamination. Moreover, this requires the electrodes to be transferred later on the ceramic greenware sheets which have been formed in a uniform thickness, and consequently it cannot be avoided that a lamination unevenness occurs due to the thickness of the electrodes, leaving problem 3 unsolved. Also in Japanese Laid-Open Patent Publication No. 63-51616, such a method is proposed that an electrode ink film is placed over a ceramic greenware sheet after forming the electrode ink film on a base film, and the electrode ink film is thermally transferred onto the ceramic greenware sheet, next of which a plurality of ceramic greenware sheets are laminated and sintered. With this method, however, thermal transfer of electrode ink film is needed before the lamination of the ceramic greenware sheets by means of heat, and additional heat cycles are applied to the ceramic greenware sheet, resulting in poor accuracy. It also causes the electrode to be thermally transferred after thermal transfer onto a ceramic greenware sheet which has thermally softening characteristics, not onto a base film of accurate size. During this thermal transfer of the electrode, not only the ceramic greenware sheet but also the base film undergo thermal deformation, which causes an increase in the possibility of deterioration in the lamination accuracy. Therefore, it is indispensable in this method to use base films of excellent heat resistance (free from thermal deformation), which causes an increase in the production cost. Moreover, electrodes are transferred later on the surfaces of the ceramic greenware sheets which have been formed with uniform thickness in this method, which causes difficulties to avoid lamination irregularities that occur due to the thickness of the electrodes, leaving the problem 3 unsolved.

Also, in Japanese Laid-Open Patent Publication No. 63-51617, a method of electrode transfer is proposed in which a given pattern of electrodes is transferred from an electrode layer onto a ceramic greenware sheet by heat-pressing a film against the ceramic greenware sheet by means of a die which has projections corresponding to the electrode pattern. In this case, however, the projection of the die unavoidably causes the ceramic greenware sheet thickness to change at points where it is pressed by the projections. Moreover, the same number of projections as the electrodes are needed, resulting in a variation of the pressure from projection to projection. This also results in a variation of the thickness or compression ratio of the portion of the ceramic greenware sheet corresponding to the position of each electrode. Moreover, even in a projection for the transfer of a single electrode, there exists a pressure distribution (a phenomenon generally called the marginal zone which causes an unevenness in the density of the printed ink in a relief press process) which causes the thickness of the ceramic greenware sheet to vary. Furthermore, because the base film, on which the ceramic greenware sheet is formed, as well as the ceramic greenware sheet are subject to a local thermal pressure before lamination, they are likely to undergo irregular deformation. Also, in the same way as that of the method proposed in Japanese Laid-Open Patent Publication No. 63-51616, thermal transfer of the electrode is performed not on a base film of an accurate size but is performed after thermal transfer onto a ceramic greenware sheet which has thermal softening characteristics. Thus, this method cannot solve problem 3, as described in the method of Japanese Laid-Open Patent Publication No. 63-51616.

In Japanese Laid-Open Patent Publication No. 63-53912, a method for forming internal electrodes for ceramic lamination is proposed where an electrode ink film which includes UV setting resins to form the internal electrodes is transferred onto a ceramic greenware sheet and then laminated. With this method, however, the part of the electrode ink which is in contact with the carrier film hardens, and the part of the electrode ink positioned on its surface (opposite to the carrier film) does not undergo complete hardening or does not harden at all and remains sticky. The surface of the electrode ink that is in a half-dried condition as mentioned above tends to catch dust and dirt if the chance allows, and is difficult to be handled. After printing the electrode ink on the carrier film, the film cannot be wound because the surface of the film is not dried. Moreover, after transfer of the electrode ink onto the ceramic greenware sheet, the ceramic greenware sheet is not held on the carrier film but is laminated. Therefore, when the ceramic greenware sheet has a thickness of 20 micrometers or less, it is too weak in mechanical strength to be handled. As a result, there is a limitation to the decrease in the thickness of ceramic greenware sheets.

Approaches to solve problem 2 include one which forms electrodes on a base film beforehand. For example, Japanese Patent Publication No. 40-19975 proposes a method where an electrode ink film is printed on a base film, and then a ceramic greenware sheet is formed thereon by a casting process. Japanese Patent Publication No. 40-19975 proposes a method where ceramic greenware sheets with electrodes embedded therein are obtained by applying electrode ink to base films and drying it, then continuously applying dielectric material slurry thereto, and peeling it off from the support (base film). Although this-method solves problem 2 to some extent, it cannot solve problem 1. That is, because ceramic greenware sheets with electrodes embedded therein prepared by those methods are laminated after being peeled off from the base film, the mechanical strength is drastically decreased with a decrease in the film thickness. Thus, the problem that the sheets cannot be handled when the thickness thereof is 20 micrometers or less (problem 1) remains unsolved.

Methods for manufacturing laminated-ceramic capacitors by embedding electrodes in ceramic greenware sheets are proposed in Japanese Laid-Open Patent Publication No. 55-124225 and Japanese Patent Publication No. 62-35255. these methods are to laminate a dielectric material and an electrode alternately on a single base film so as to form multiple layers by means of a gravure printing or the like, and are not free from the problem of the ceramic greenware sheets being eroded by the solvent included in the electrode.

Moreover, Japanese Patent Publication No. 60-49590 proposes a method in which a first electrode is printed onto a first ceramic greenware sheet, then a paste which includes ceramic powder is printed so that it covers the first electrode and is dried to form a first auxiliary ceramic layer, and a second ceramic greenware sheet is laminated onto it. With this method, a ceramic greenware sheet layer and an auxiliary ceramic layer are formed between the internal electrodes; namely, double ceramic greenware sheet layers are formed. A similar method is proposed in Japanese Patent Publication No. 62-27721. However, with either method, the ceramic greenware sheet on which an electrode is formed (or an electrode is embedded therein) is laminated in a state of being peeled off from the base film. As a result, when the thickness of the ceramic greenware sheet is decreased below 20 micrometers, the ceramic greenware sheet becomes too weak in mechanical strength to be handled. Thus there is a limit to a decrease in the ceramic greenware sheet thickness.

Japanese Laid-Open Patent Publication Nos. 52-135050 and 52-133553 propose such methods that a ceramic greenware sheet from which portions corresponding to the internal electrodes at the part of a step, i.e., the peripheral section, have been removed is interposed, laminated and sintered. These methods require to accurately remove several hundreds of portions with a size of e.g., measuring 3.5 mm by 1.0 mm each from the ceramic greenware sheet. However, it is almost impossible to handle the ceramic greenware sheet individually because of its thinness and softness. Even though it can be handled, it is very difficult to punch it off precisely.

Similarly in Japanese Laid-Open Patent Publication No. 61-102719, a method for manufacturing laminated-ceramic capacitors by punching both ceramic greenware sheets and electrode sheets and laminating them alternately is proposed. However, this has a problem in the applicability to mass production. For example, it is disadvantageous to punch many pieces at a time compared to a printing process, in terms of the production cost and accuracy. In addition, when the thickness of electrodes is decreased below 5 micrometers, physical strength of the electrode sheet cannot withstand the punching and handling processes.

Japanese Laid-Open Patent Publication No. 52-135051 proposes a method in which an internal electrode ink is first applied to a ceramic greenware sheet, and a dielectric ink is applied to the rest of the ceramic greenware sheet surface, and ceramic greenware sheets with the electrode ink and the dielectric ink applied thereto are laminated while shifting the position to avoid overlapping of leads of the electrodes, and are pressurized and sintered. However, this method leaves a problem that lower layers in the lamination are eroded by solvent included in the dielectric ink which is to be printed later. As a result, the thinner the ceramic greenware sheet, the more likely the characteristics of short circuit and withstanding voltage to deteriorate.

A method for forming electrodes without using any solvent in electrodes ink is proposed in Japanese Laid-Open Patent Publication No. 53-51458. There is also a method based on a non-electrolytic plating technique using an activated paste, such as that which is proposed in Japanese Laid-Open Patent Publication No. 57-102166. However, since the electrodes are formed by means of a non-electrolytic plating technique, immersion of ceramic greenware sheets in a plating liquid causes a new problem.

Other methods of partially punching ceramic greenware sheets or embossing them have been proposed such as those in Japanese Laid-Open Patent Publication No. 53-42353, but they are not practical.

A method proposed in Japanese Laid-Open Patent Publication No. 56-94719 is similar to the above, and is to form ceramic greenware sheets at steps which have arisen on the laminated layers. This method is not suitable for mass production, Problems which make it difficult to manufacture laminated-ceramic capacitors such as follows have been described in the above, explaining that various methods proposed so far are not capable of satisfactorily solve problems 1 through 3: Insufficient mechanical strength due to the thinness of ceramic greenware sheets and an accompanying difficulty in handling them (problem 1), an increase in the probability of a short circuit occurrence due to the effect of the ink during a printing process of the electrode ink on the ceramic greenware sheet as the ceramic greenware sheet is made thinner (problem 2), and defects such as delamination and crack due to an unevenness caused by the difference in the thickness between the center and the periphery, which makes uniform lamination impossible (problem 3).

In addition to the problems described above, a conventional method includes such a problem that wire breakage or lower product quality is caused when electrodes are impaired during the preparation of ceramic greenware sheets with electrodes embedded therein by applying ceramic slurry in a thin film on the electrodes formed on a support.

Thus, there have been no proper method for applying ceramic slurry by which electrodes are embedded therein. This situation will be explained in the following with reference to FIGS. 5 and 6.

FIG. 5 is a drawing explanatory of a process for applying ceramic slurry by the use of a gravure printing press. In FIG.

5, the reference numeral 12 is ceramic slurry, 13 is the gravure plate, 14 is the cell, 15 is the doctor and 16 is the impression cylinder. The ceramic slurry 12 enters into the cell 14 which is formed on the surface of the gravure plate 13 and is, after the excess ceramic slurry is scraped off by the doctor 15, applied onto the surface of a base film 9 which is pressed against the gravure plate 13 by the impression cylinder 16. Then the ceramic slurry 12 applied onto the surface of the base film 9 is dried, resulting in a ceramic greenware sheet 10.

FIG. 6 is a drawing explanatory of a process for applying ceramic slurry onto a base film with an electrode formed thereon by means of a gravure printing press. In FIG. 6, the reference numeral 17 is the electrode which is dried after printing. What is different from FIG. 5 is that the electrode 17 is formed on the surface of the base film 9 in advance. In a case that the electrode 17 is embedded in the ceramic greenware sheet 10 as shown in FIG. 6, the pressure of the gravure printing press to apply the ceramic slurry cannot be decreased because of the presence of the impression cylinder 16, resulting in damage to the electrode 17 and making it impossible to stably embed the electrode in the ceramic greenware sheet 10.

FIGS. 7(A) to (C) are drawings explanatory of irregularities, due to the electrodes, being generated on the slurry surface as the ceramic slurry is dried after embedding the electrodes in the ceramic slurry. In FIG. 7, the reference numeral 18 is the ceramic greenware sheet on which surface irregularities have been generated and 19 is the ceramic greenware sheet with electrodes embedded therein where surface irregularities have been generated.

The electrode 17 which is formed on the base film 9 as shown in FIG. 7(A) is embedded in the ceramic slurry 12 as shown in FIG. 7(B). Then, when the ceramic slurry 12 is dried to form the ceramic greenware sheet 18, surface irregularities due to the electrode 17 are generated on the ceramic greenware sheet 18 as shown in FIG. 7(C). While the generation of such surface irregularities depends on the thickness of the electrode 17, it becomes conspicuous as the thickness of the ceramic greenware sheet 18 is decreased, below 20 micrometers.

DISCLOSURE OF THE INVENTION

The present invention, which solves the problems with the prior art, is to provide a method for manufacturing laminated-ceramic electronic components which does not deteriorate the handleability of ceramic greenware sheets even when their thickness is decreased, and is capable of reducing the occurrence of surface irregularities due to the thickness of the electrodes even when the number of layers laminated is increased.

In order to achieve the above-mentioned object, the method for manufacturing laminated-ceramic electronic components according to the invention is characterized in that a ceramic greenware sheet with electrodes embedded therein which is formed on a support is, without being peeled off from the support, pressure-bonded on a second ceramic greenware sheet or other electrodes, then the support alone is peeled off and the ceramic greenware sheet with the embedded electrodes is transferred onto the second ceramic greenware sheet or the other electrodes to complete a lamination.

This manufacturing method does laminate thin ceramic greenware sheets, the thickness of each of which is as thin as below 20 micrometers while maintaining their mechanical strength by handling electrodes and ceramic greenware sheets together with supports.

Also, according to the invention, because the electrodes are embedded in the ceramic greenware sheets, an occurrence of surface irregularities due to the electrodes can be reduced more than in the case that electrodes on the ceramic greenware sheets are formed.

Especially, according to the invention, an occurrence of irregularities on the surface of a ceramic greenware sheet with electrodes embedded therein due to the electrodes, can be prevented and a ceramic greenware sheet with electrodes embedded therein, the smoothness of the surface of which is effectively achieved, can be manufactured by methods such as; exposing a ceramic slurry, which has been applied to a support, to air blow in a direction other than right angles to the surface of the coated layer, exposing the ceramic slurry to an air blow from a plurality of nozzles, drying the ceramic slurry by tilting the support, applying the ceramic slurry by means of a doctor blade or an applicator which has a regular surface unevenness, and applying the ceramic slurry by a screen printing technique which involves a rotary screen. By the use of ceramic greenware sheets with electrodes embedded therein the surface of each of which are effectively smoothed, it is possible to manufacture laminated-ceramic electronic components in which a high degree of lamination has been achieved with thin layers.

Thus, according to the invention, because the electrodes are dried, a possibility that the ceramic greenware sheets are eroded by a solvent included in the electrode ink resulting in swelling and short circuit, is reduced. Moreover, steps generated due to the electrodes are reduced by embedding the electrodes in the ceramic greenware sheets even when the dried electrodes are applied to the manufacture of multi-layered laminated-ceramic capacitors.

A gravure printing technique which uses no impression cylinder can be also adopted when embedding the electrodes in the ceramic greenware sheets. In this case, a ceramic slurry can be applied without damaging the electrodes which are formed on the surface of a support.

BRIEF DESCRIPTION OF THE DRAWINGS

FIGS. 10 and 11 are drawings explanatory of variations of the first example of the invention.

FIGS. 13 to 16 are drawings explanatory of a process for laminating ceramic greenware sheets with electrodes embedded therein by the use of pins in positioning.

FIGS. 29(A) to (D) are drawings explanatory of the process for manufacturing a ceramic greenware sheet with electrodes embedded therein in a second example of the invention.

FIGS. 32 to 35 are drawings explanatory of the process for manufacturing a ceramic greenware sheet with electrodes embedded therein in a fifth example of the invention.

BEST MODE OF CARRYING OUT THE INVENTION

Examples of the invention are described below with reference to the drawings.

EXAMPLE 1

The first example of a method for manufacturing laminated-ceramic electronic components of the invention taking laminated-ceramic capacitors as an example is explained with reference to the drawings.

Figure 8:
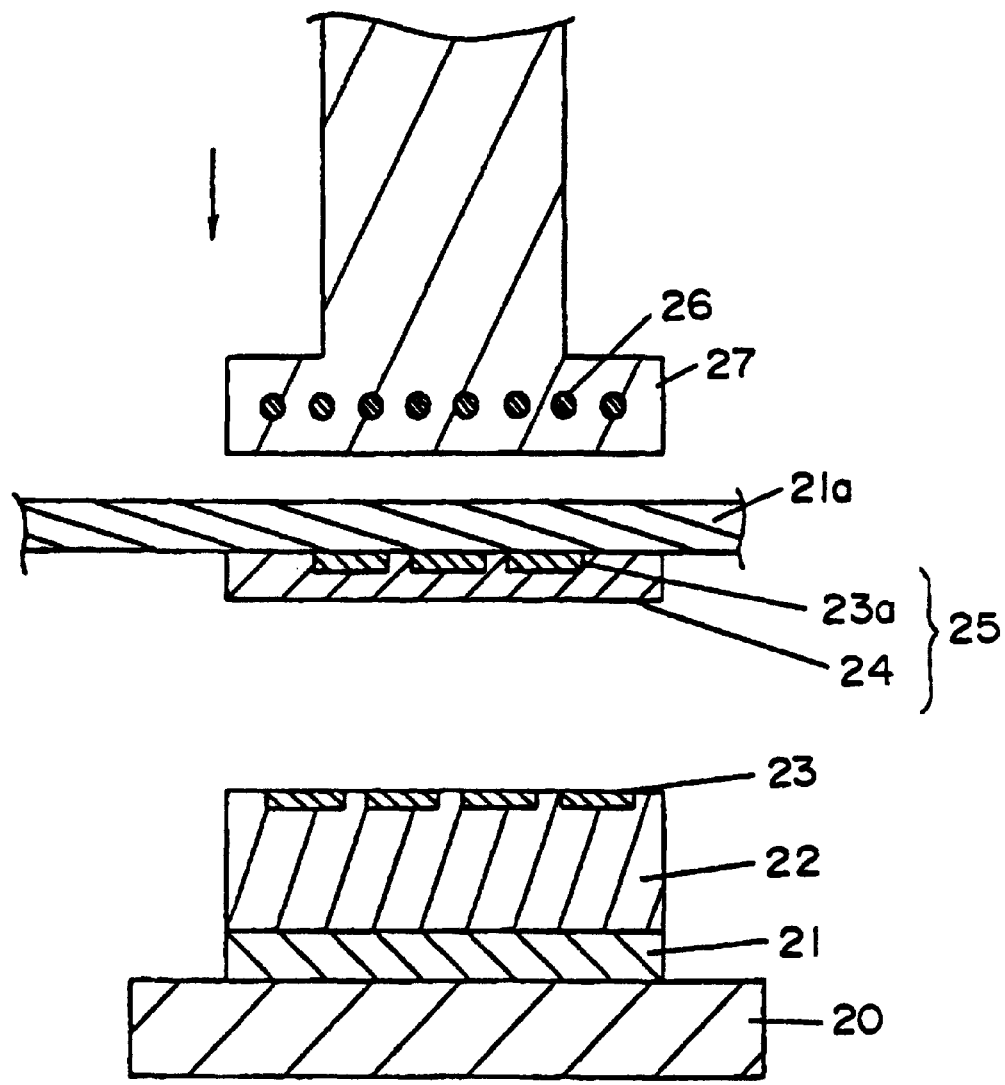
FIGS. 8 and 9 are drawings explanatory of the process for laminating ceramic greenware sheets with electrodes embedded therein in a first example of the invention.
Figure 9:
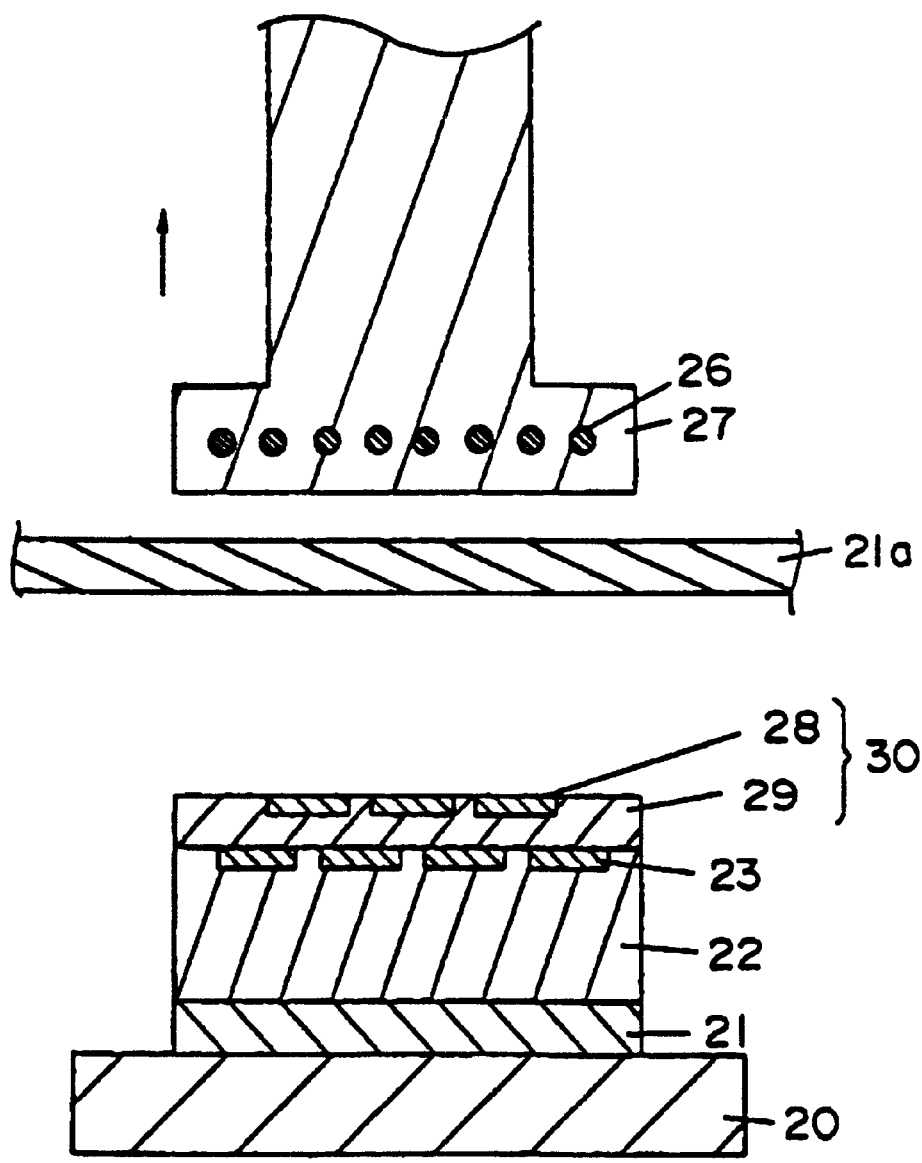

FIGS. 8 and 9 show a process for laminating ceramic greenware sheets with electrodes embedded therein in the first example of the invention. In FIGS. 8 and 9, the reference numeral 20 is a stage, 21 and 21a are base films, 22 is a laminated body of ceramic greenware sheets, 23 and 23a are electrodes, 24 is a ceramic greenware sheet, 25 is a ceramic greenware sheet with an electrode embedded therein, which consists of the electrode 23a and the ceramic greenware sheet 24. The reference numeral 26 is a heater, 27 is a pressurization plate, 28 is a transferred electrode, 29 is a transferred ceramic greenware sheet, 30 is a ceramic greenware sheet with transferred electrode embedded therein, which consists of the transferred electrode 28 and the transferred ceramic greenware sheet 29. The arrow indicates the direction in which the pressurization plate 27 moves. The pressurization plate 27 can be heated by means of the heater 26 as required.

Reference is first made to FIG. 8 in the following explanation. First the pressurization plate 27 which can be heated by means of the heater 26, as required, is placed on the base film 21a at the side where ceramic greenware sheet 25 with electrode embedded therein is not formed. On the other hand, the base film 21 and the laminated ceramic greenware sheet 22 which are fixed on the stage 20 are placed on the side of the base film 21a where the ceramic greenware sheets 25 with electrodes embedded therein is formed. At this time, the electrode 23 is formed on the surface of the laminated ceramic greenware sheet 22 by transfer, printing or other appropriate means. It is not necessarily required for the electrode 23 to be formed on the surface of the laminated ceramic greenware sheet 22. Then, starting with the condition shown in FIG. 8, the ceramic greenware sheet 25 with electrodes embedded therein, which is formed on the surface of the base film 21a, is pressed against the surface of the laminated ceramic greenware sheet 22, by the pressurization plate 27 to stick to the laminated ceramic greenware sheet.

Then, reference is made to FIG. 9 in the explanation that follows. FIG. 9 shows the state after transferring the ceramic greenware sheets 25 with electrodes embedded therein shown in FIG. 8. Namely, as shown in FIG. 9, the ceramic greenware sheet 25 with electrodes embedded therein on the base film 21a is transferred onto the surface of the laminated ceramic greenware sheet 22 by the pressurization plate 27 to thereby form a transferred ceramic greenware sheet 30 with electrode embedded therein, which comprises transferred electrode 28 and a transferred ceramic greenware sheet 29.

Figure 10:
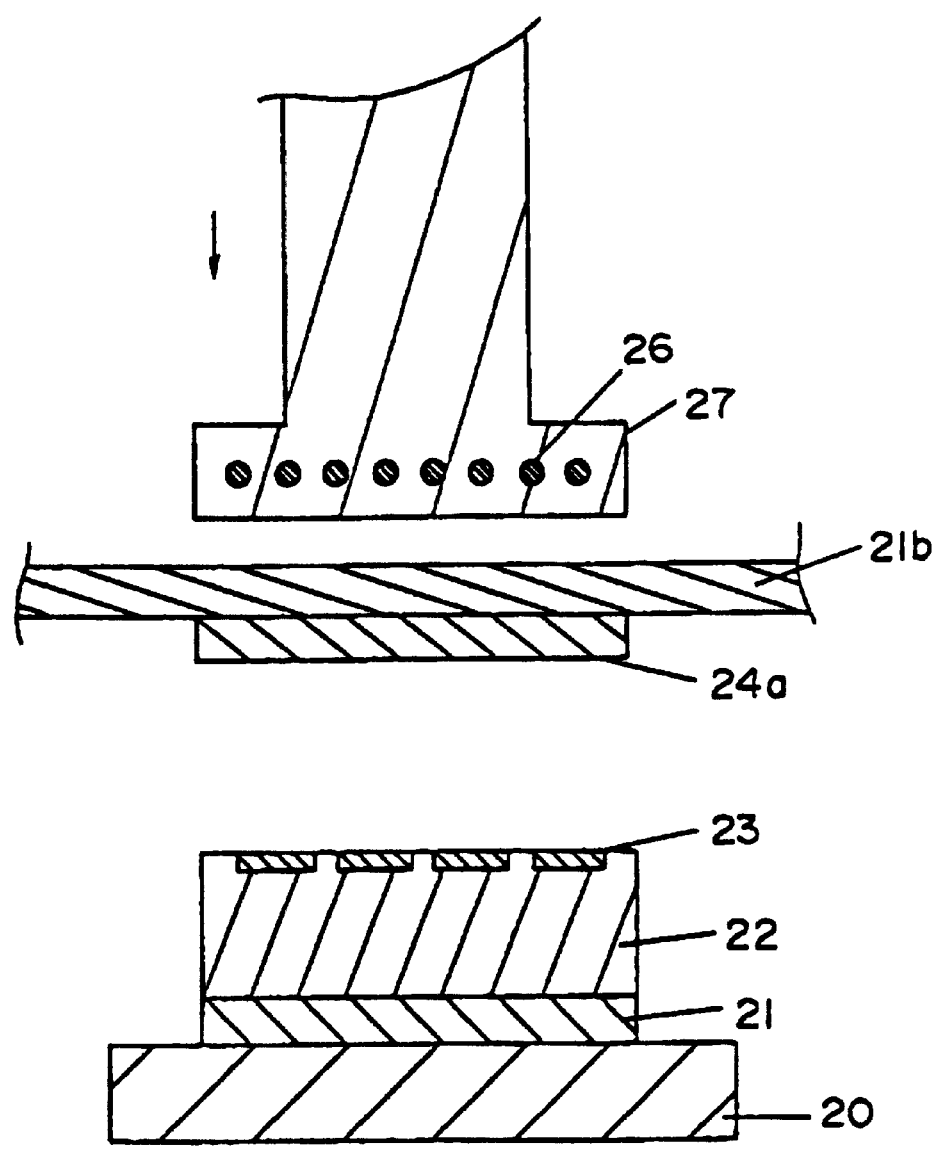

FIGS. 10 and 11, which show variations of the first example, are drawings explanatory of a process in which pressure-adhering the ceramic greenware sheet 25 with electrodes embedded therein is pressure adhered onto the transferred ceramic greenware sheet 29a after the transferred ceramic greenware sheet is formed by pressure-adhering the ceramic greenware sheet 24a which is formed on the base film 21b onto the surface of the laminated body of ceramic greenware sheet 22 on which the electrodes 23 are formed. Lamination of multiple layers can be performed by repeating the process shown in FIGS. 8 and 9 and the process shown in FIGS. 10 and 11.

The above processes are described below in more detail. For the electrode ink which makes the electrodes, palladium electrode ink available in the market was used to which a solvent was added to obtain appropriate viscosity.

For the base film 21a for the electrode 23a (and for ceramic greenware sheet 24), a rolled polyethylene terephthalate film (called PET film hereafter) having a film width of 200 mm, film thickness of 75 micrometers, a central core diameter of 3 inches and a length of about 100 meters was used. The electrode ink was printed consecutively on the PET film with constant intervals by a screen printing technique using a stainless screen which had an emulsion thickness of 10 micrometers and 400 mesh. The electrodes used here measure 3.5 mm by 1.0 mm. In the drying process for the electrode ink after printing, a belt furnace operating in the infrared spectrum heated to about 125° C. was connected following the printing press, to evaporate the solvent which was included in he electrode ink, resulting in the electrode 23a.

An explanation of the process of preparing the ceramic slurry is as follows. To a resin solution consisting of 0.6 weight part of plasticizer based on dibutyl phthalate and 61.0 weight part of alcoholic solvent, a 6.0 weight part of a binder resin which is mainly composed of polyvinylbutyral resin was added, together with 31.0 weight part of barium titanate powder which has a particle size of about 1 micrometer, and the mixture was vigorously stirred. Then the mixture was put into a polyethylene bottle to which zirconia beads were added and stirred until appropriate dispersed condition was obtained. After a primary filtration, the mixture was subjected to pressure-filtration using membrane filter of 5 micrometers mesh to make the ceramic slurry.

The ceramic slurry was applied continuously to the base film 21a where the electrode 23a was formed by using an applicator. The base film 21a with ceramic slurry applied thereto was dried with care not to allow surface irregularities due to the electrode embedded in the surface to occur, resulting in a ceramic greenware sheet 25 with electrodes embedded therein. When measured with a micrometer, the ceramic greenware sheet 25 had a thickness of 18 micrometers.

Described below is a method for manufacturing laminated-ceramic capacitors using ceramic greenware sheets 25 with electrodes embedded therein. A laminated body of ceramic greenware sheets 22, which is 100 micrometer thick on which no electrode is formed, was fixed onto the stage 20 which is shown in FIG. 8, together with the base film 21. Onto the laminated body of ceramic greenware sheets 22, ceramic greenware sheets 25 with electrodes embedded therein were transferred in the number required for lamination as shown in FIGS. 8 and 9. The transfer operation was performed at a temperature of 80° C. under a pressure of 15 kg/cm using the pressurization plate 27 from the side of the base film 21a. After pressure-adhesion of the ceramic greenware sheets 25 with electrodes embedded therein, the base film 21a was peeled off.

Figure 1:
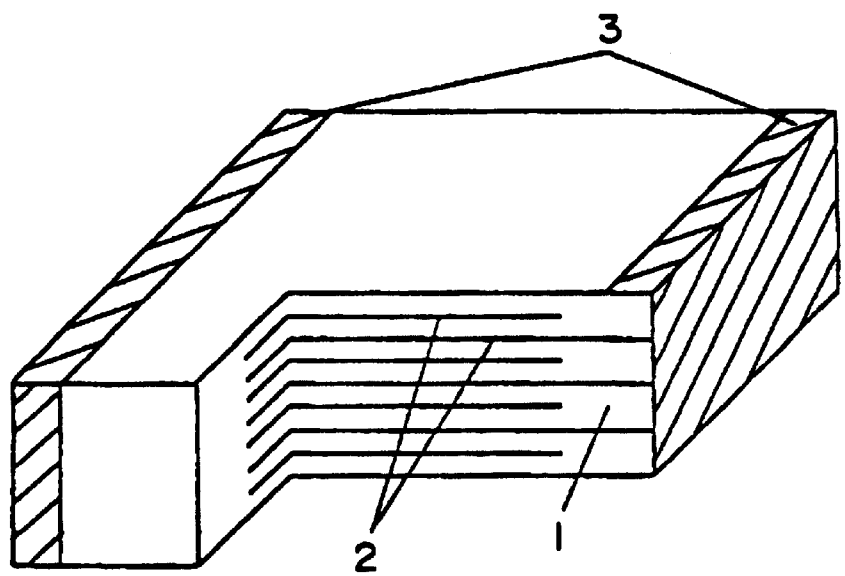
FIG. 1 in a cross sectional view of a part of a laminated-ceramic capacitor.

The above process was repeated so that the electrodes were staggered as shown in FIG. 1, and were laminated in 51 layers. Finally, as the counter-measures against warping during firing and in order to increase the mechanical strength, a ceramic greenware sheet a 100 micrometer thick with no electrode formed thereon was transferred. The laminated body thus obtained was cut into chips of a size of 2.4 mm by 1.6 mm each, and were sintered at 1300° C. for 1 hour and external electrodes were formed in the specified procedure. Laminated-ceramic capacitors of the invention were manufactured in the processes described above.

Figure 2:
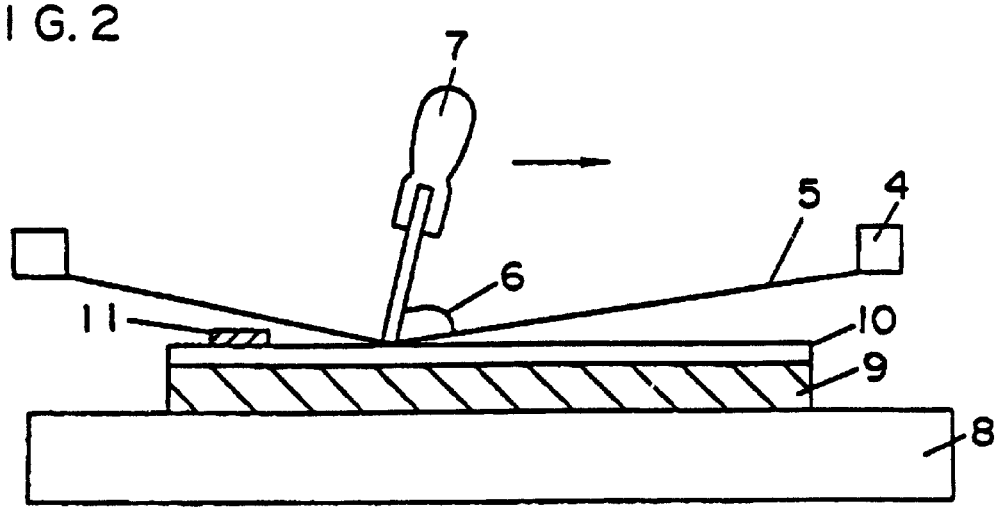
FIG. 2 is a drawing explanatory of a process for printing electrode ink on a ceramic greenware sheet by means of a screen printing technique.
Figure 3:
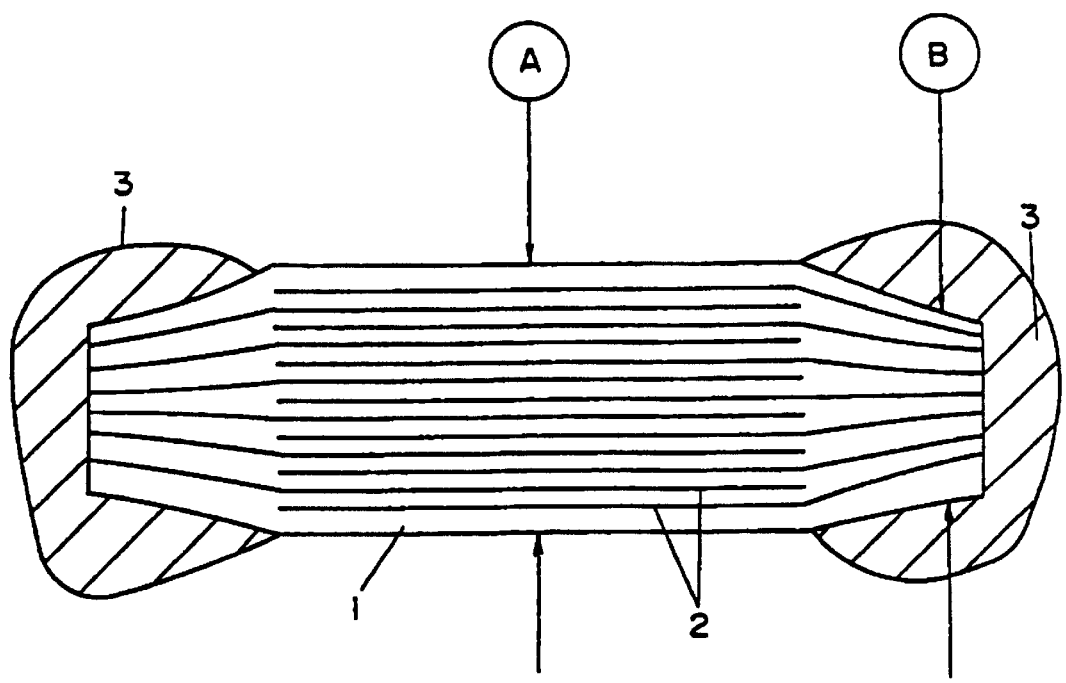
FIG. 3 is a cross sectional view of a laminated-ceramic capacitor when multi-layered.

For the purpose of comparison, laminated-ceramic capacitors were manufactured by a conventional method, using ceramic greenware sheets which were prepared by applying the ceramic slurry of the above-mentioned example directly onto a base film by means of an applicator and drying them. When measured with the micrometer, the thickness of the ceramic greenware sheet was 18 micrometers. The ceramic greenware sheet, because it was too thin and brittle, could hardly be handled when it was separated from the base film. For this reason, the ceramic greenware sheet was used without peeling it off from the base film. Consequently, ceramic greenware sheets with electrodes formed thereon were made by printing the electrode ink of the above-mentioned example directly on a ceramic greenware sheet which was adhered onto the base film by a screen printing technique as shown in FIG. 2, and drying it. Then the ceramic greenware sheet with electrodes formed on the surface thereof was likewise pressure-adhered by using the above-mentioned pressurization plate without peeling it off from the base film, and then, by peeling off the base film, lamination was completed.

Tables 1 and 2 show the transfer characteristics of the ceramic greenware sheets with electrodes embedded therein manufactured according to the invention, and the ceramic greenware sheets with electrodes formed on the surface thereof manufactured according to a conventional method, which were examined under various transfer conditions including temperatures and pressures.

TABLE 1

| Method Transfer condition | Present invention Ceramic greenware sheets with electrodes embedded therein | Prior art Ceramic greenware sheets with electrodes formed on the surface thereof |
|---|---|---|
| 80° C. 15 kg/cm$^2$ | Transferable | Non-transferable |
| 80° C. 100 kg/cm$^2$ | Transferable | Non-transferable |
| 80° C. 500 kg/cm$^2$ | Transferable | Transferable |

TABLE 2

| Method Transfer condition | Present invention Ceramic greenware sheets with electrodes embedded therein | Prior art Ceramic greenware sheets with electrodes formed on the surface thereof |
|---|---|---|
| 30° C. 15 kg/cm$^2$ | Partially transferable | Non-transferable |
| 80° C. 15 kg/cm$^2$ | Transferable | Non-transferable |
| 150° C. 15 kg/cm$^2$ | Transferable | Non-transferable |

It will be clear from Tables 1 and 2 that the ceramic greenware sheets with electrodes embedded therein manufactured according to the invention is superior in transferability over those manufactured according to the conventional method.

The ceramic greenware sheets with electrodes formed on the surfaces thereof manufactured according to the conventional method were laminated under the conditions of 80° C. and 500 kg/cm$^2$ and were cut and fired under the same conditions including the number of laminated layers as those in the above-mentioned example, resulting in products of the prior art.

Then, the short circuit occurrence rate and the delamination occurrence rate were investigated on samples of the products of the invention and the prior art, each in a volume of 100 pieces. The results are shown in Table 3 below.

The rate of short circuit occurrence refers to the rate of insulation failures occurring when a specified voltage (ordinarily three times the rated voltage) is applied. The rate of delamination occurrence was obtained by polishing the products (laminated-ceramic capacitors) and observing the cross section with a microscope.

TABLE 3

| Manufacturing method | Short circuit occurrence rate (%) | Delamination occurrence rate (%) |
|---|---|---|
| Present invention | 5 | 3 |

TABLE 3-continued

| Manufacturing method | Short circuit occurrence rate (%) | Delamination occurrence rate (%) |
|---|---|---|
| Prior art | 95 | 100 |

From the above description, it will be clear that both the short circuit occurrence rate and the delamination occurrence rate can be greatly improved by adopting the method of manufacturing laminated-ceramic capacitors of this invention. Through a study on the causes of short circuits in the products of the invention, it was supposed that a large part of the short circuits were caused by pin holes in the ceramic greenware sheets. Also, because -the electrodes were embedded in the ceramic greenware sheets in the invention, a difference in the thickness between the center and the periphery of each laminated-ceramic capacitor was greatly improved, and it was assumed that this contributed to the reduction of the delamination occurrence rate.

The ceramic greenware sheet section of the ceramic greenware sheet with electrodes embedded therein used in the invention has thermal transfer characteristics due to the property of polyvinyl butyral resin included therein. The thermal transfer characteristics deteriorate with a decrease in the content of the polyvinyl butyral resin (called PVB resin hereafter) included therein and, on the contrary, thermal transfer characteristics becomes better with an increase in the PVB resin content. Good transfer characteristics were obtained with a ceramic greenware sheet prepared by adding about 20 g of PVB resin to 100 g of ceramic powder. However, it is supposed that the optimum content of PVB resin depends on the particle size of the ceramic powder which makes the slurry, the polymerization degree of the PVB resin, the kind of the PVB resin and the temperature during transfer. When the resin quantity is insufficient, the transfer temperature must be raised.

Table 4 shows the result of an experiment which was conducted on barium titanate powder of the particle size used in the experiment, to examine the relationship between the resin content in the ceramic greenware sheet and the transfer characteristics of the ceramic greenware sheet. The ceramic greenware sheet was made from barium titanate powder, dibutyl phthalate as a plasticizer and PVB resin, as described before. The transfer characteristics were examined while changing the weight percent of the PVB resin content. The quantity of dibutyl phthalate added to the ceramic greenware sheet was fixed at 10 wt % of the PVB resin. The transfer characteristics of the ceramic greenware sheet were tested by transferring the ceramic greenware sheet with electrodes embedded therein onto the laminated body of ceramic greenware sheets with electrodes formed on the surface thereof as shown in FIG. 8. Transfer operation was performed by pressing the pressurization plate which was heated to a temperature of 180° C. from the side of the base film with a transfer pressure of 15 kg/cm². The PVB resin content in the table is given in terms of the weight percent in the ceramic greenware sheet.

TABLE 4

| PVB resin content | Transfer characteristics |
|---|---|
| 7 (wt %) | Non-transferable |
| 10 (wt %) | Transferable (poor) |
| 15 (wt %) | Transferable (good) |
| 20 (wt %) | Transferable (good) |
| 30 (wt %) | Transferable (good) |
| 40 (wt %) | Transferable (good) |
| 50 (wt %) | Transferable (good) |
| 60 (wt %) | Transferable (good) |

Then laminated-ceramic capacitors were manufactured in the same way as those of the above-mentioned example using the ceramic greenware sheets shown the Table 4. Table 5 shows the relationship between the PVB resin content in the ceramic greenware sheets and the delamination occurrence rate.

TABLE 5

| PVB resin content | Delamination occurrence rate (%) |
|---|---|
| 7 (wt %) | Non-transferable |
| 10 (wt %) | 5(%) |
| 15 (wt %) | 3(%) |
| 20 (wt %) | 10(%) |
| 30 (wt %) | 30(%) |
| 40 (wt %) | 65(%) |
| 50 (wt %) | 100(%) |
| 60 (wt %) | 100(%) |

From Table 5 it can be seen that delamination is less likely to occur when the PVB resin content is from about 10 to 40 wt %. Thus it can be seen that good transfer characteristics and low delamination occurrence rate are obtained when the PVB resin content is from 10 to 40 wt % of the ceramic greenware sheet, especially when it is around 15 wt %.

Kinds of resin which have transferability as that of PVB resin include thermoplastic resins such as acrylic resin, vinyl resin and cellulose-derivative resins. Besides the thermoplastic resins, thermosetting resins and thermo-polymerizing resins develop transferability when they are made sticky on the surface by selecting appropriate hardening conditions and/or polymerizing conditions to turn them into rubber-like materials, for example, and may also be used for the ceramic greenware sheet.

Further as in the case shown in FIG. 8 and FIG. 9, even when ceramic greenware sheets, which include only about 5 weight part of resin for 100 weight part of barium titanate, and have no transferability, are used for the ceramic greenware sheet 24a, they can be laminated by alternately using the ceramic greenware sheets with electrodes embedded therein of the invention, which have excellent transferability.

Figure 12:
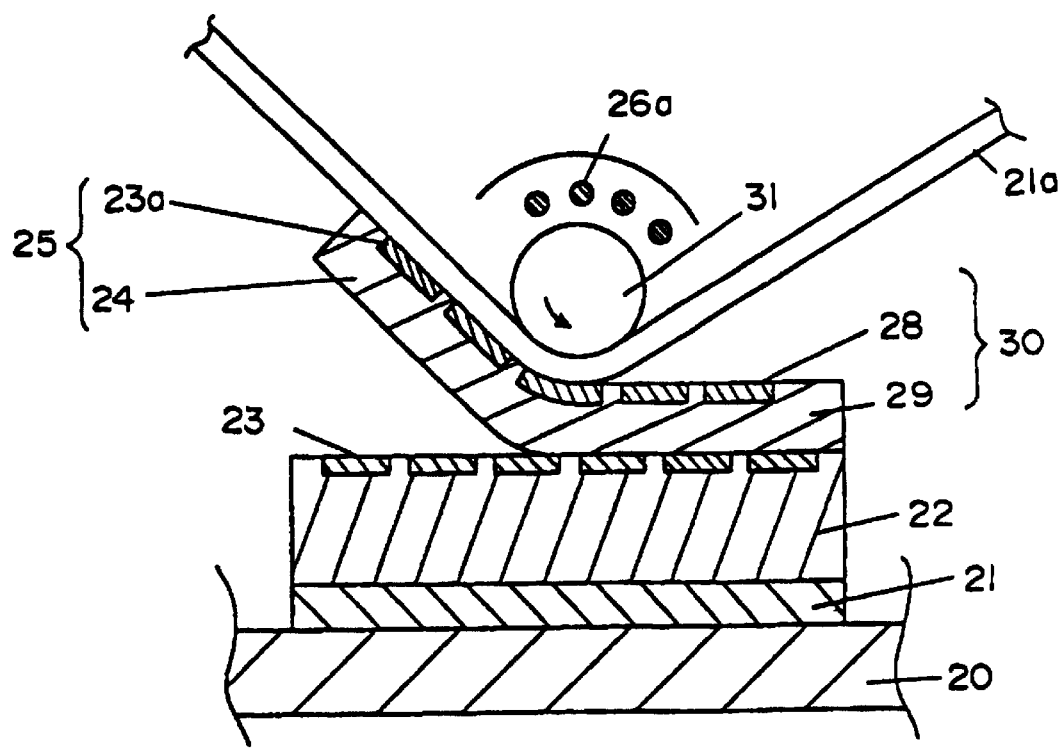
FIG. 12 is a drawing explanatory of a process for transferring ceramic greenware sheets with electrodes embedded therein by using a pressure roller.
Figure 13:
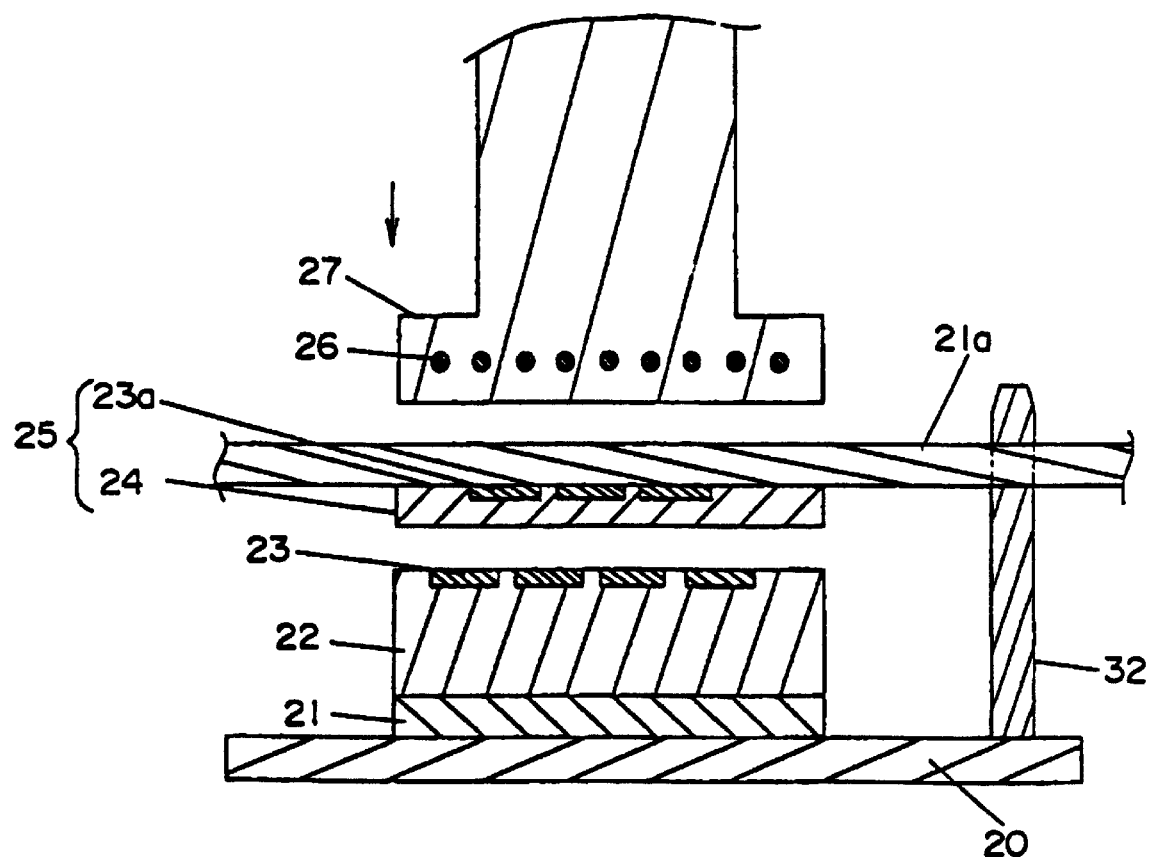
Figure 15:
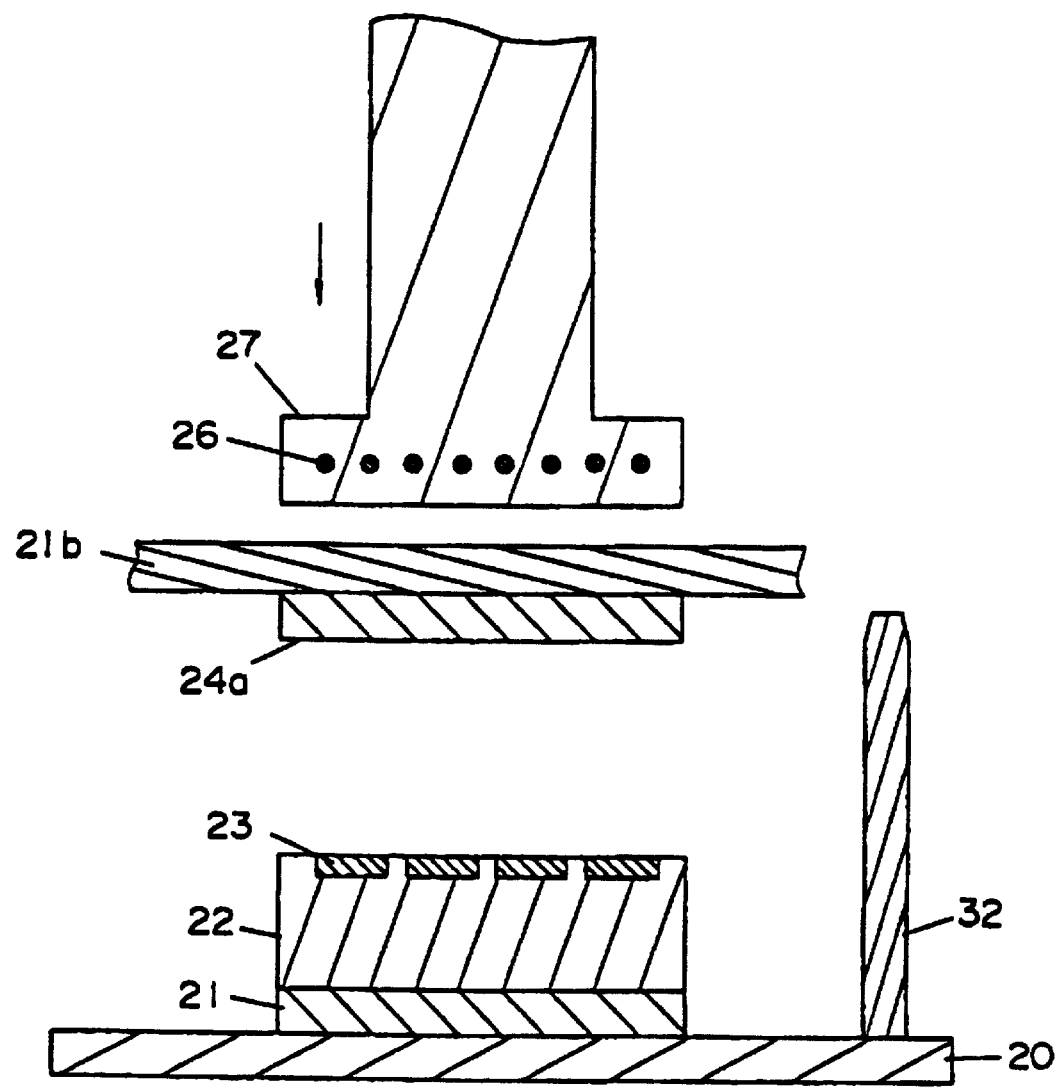
Figure 16:
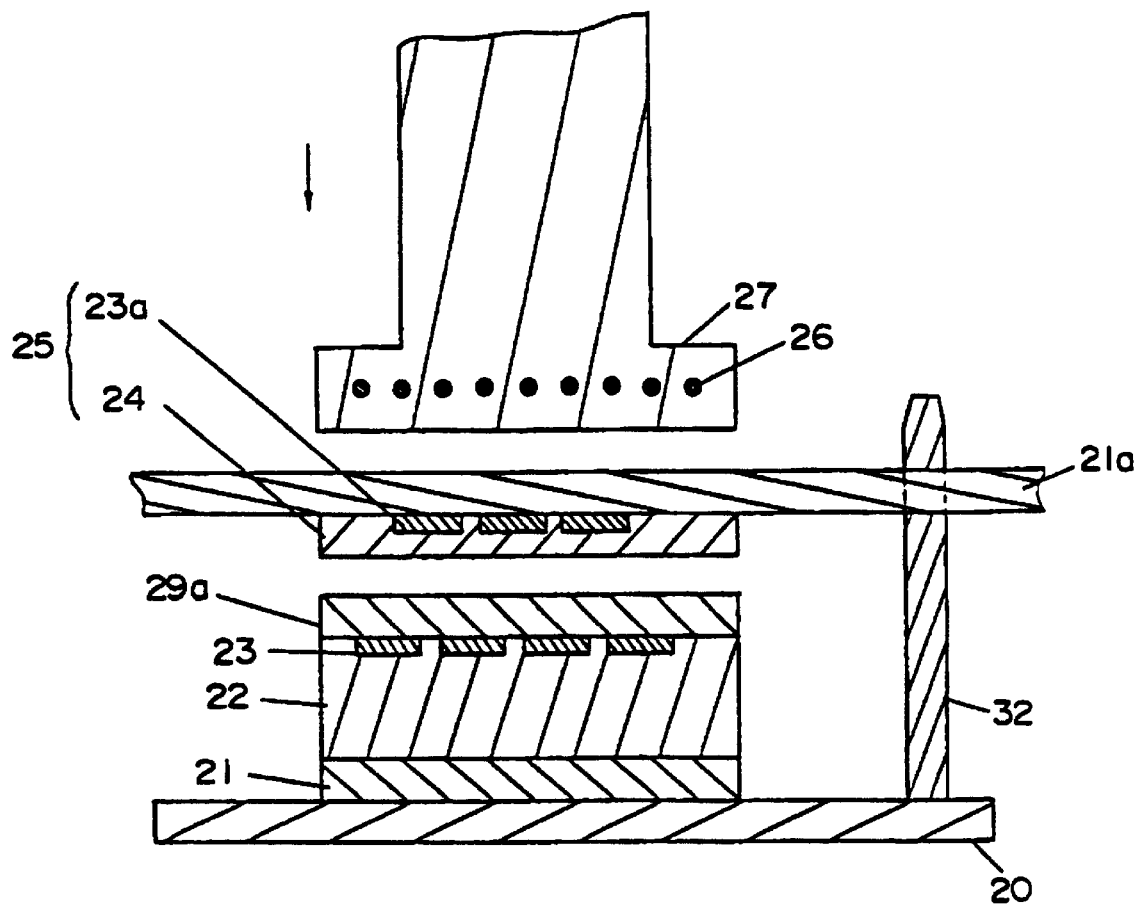
Figure 17:
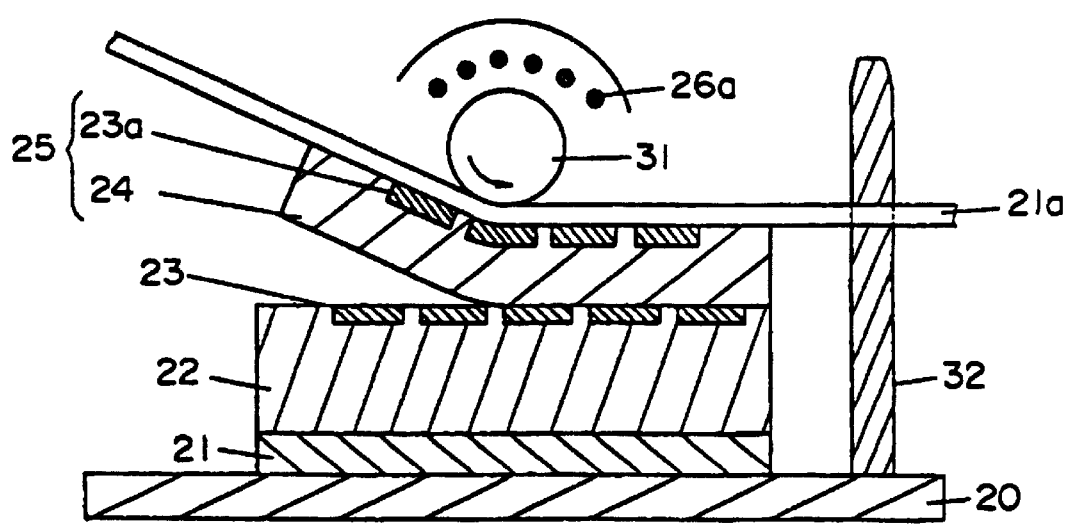
FIG. 17 is a drawing illustrative of a variation of the example shown in FIGS. 13 to 16.
Figure 18:
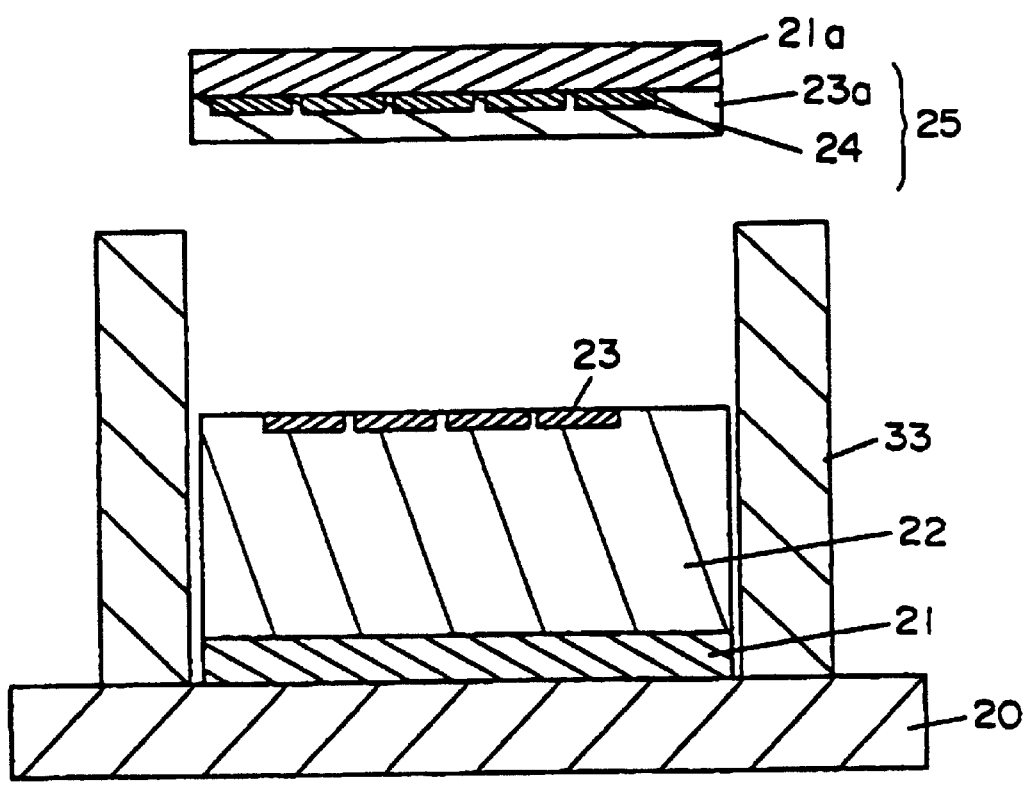
FIGS. 18 to 25 are drawings explanatory of a process for laminating ceramic greenware sheets with electrodes embedded therein by the use of a die in positioning.
Figure 19:
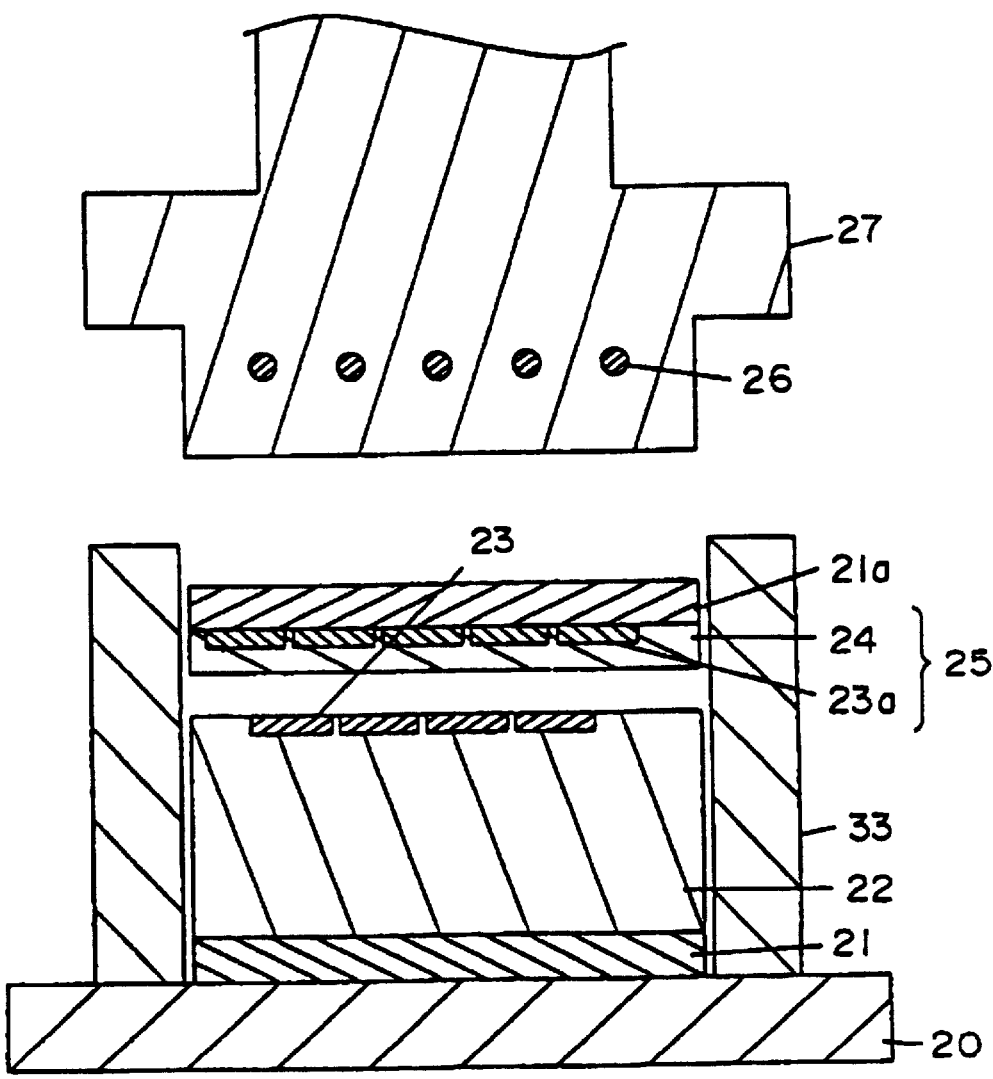
Figure 20:
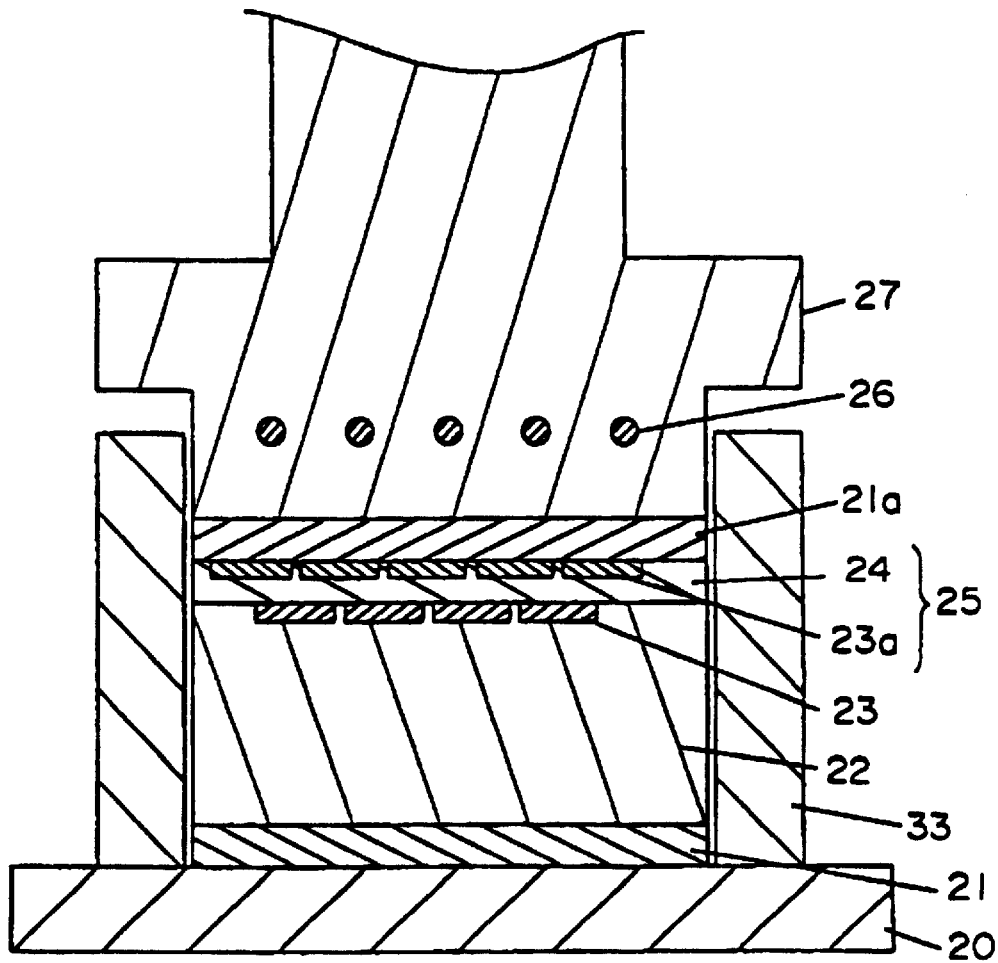
Figure 21:
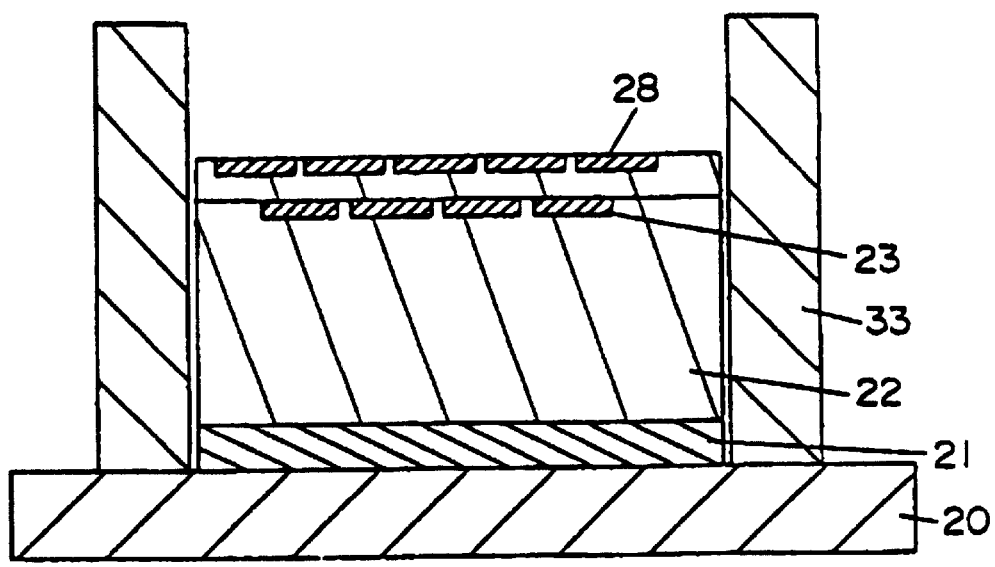
Figure 22:
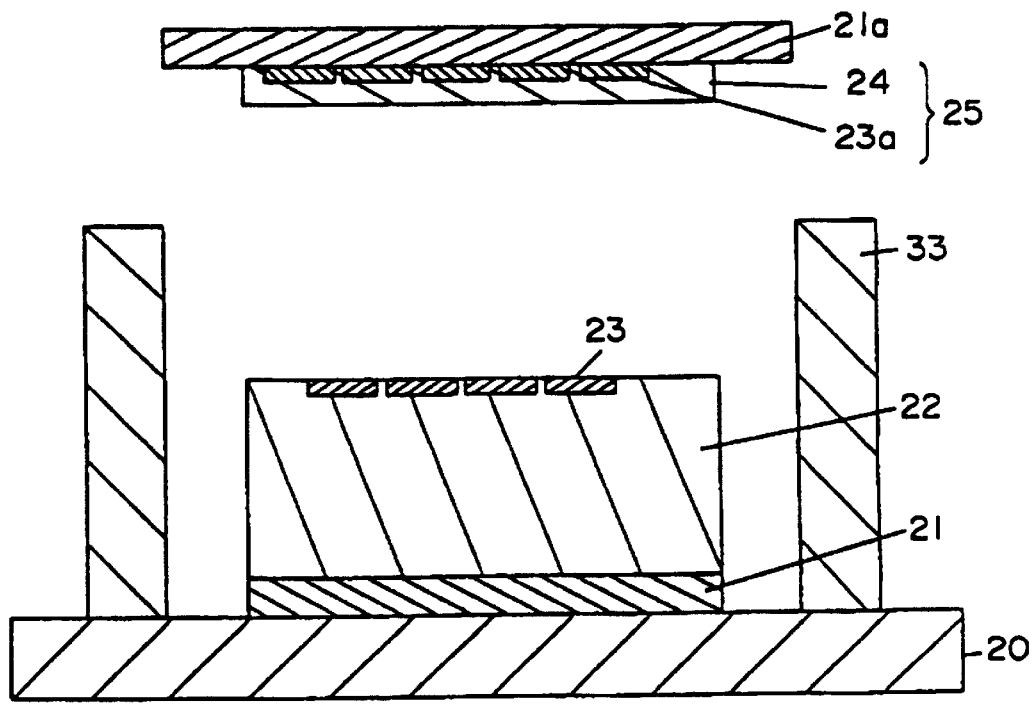
Figure 23:
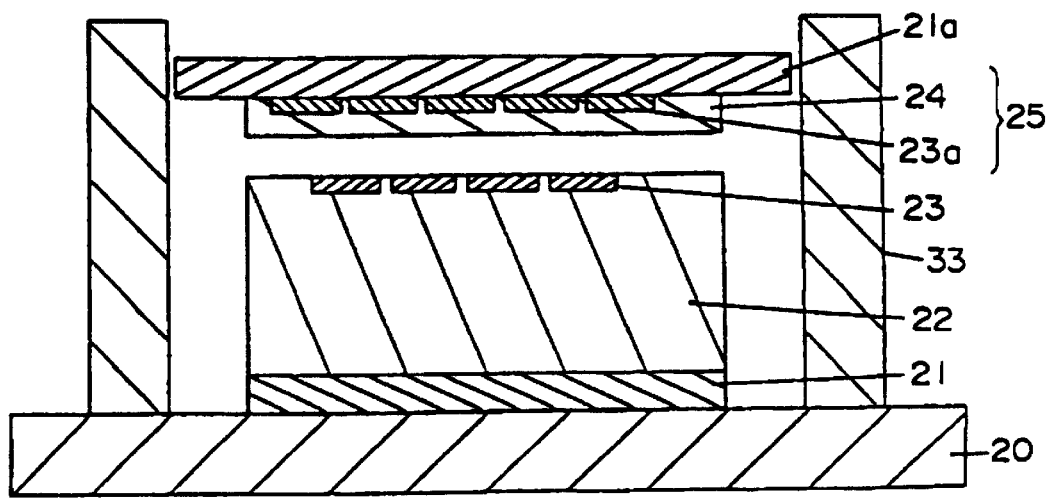
Figure 24:
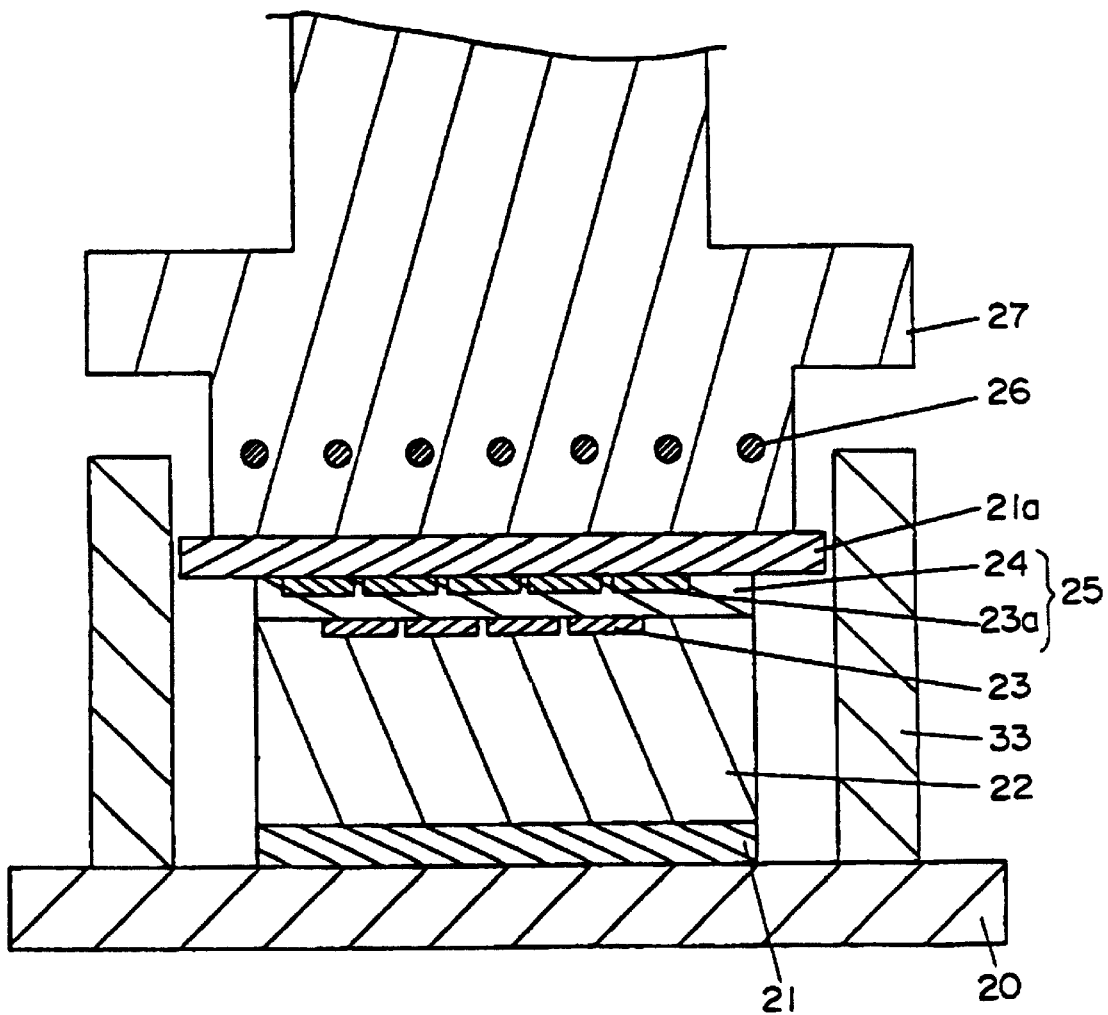
Figure 25:
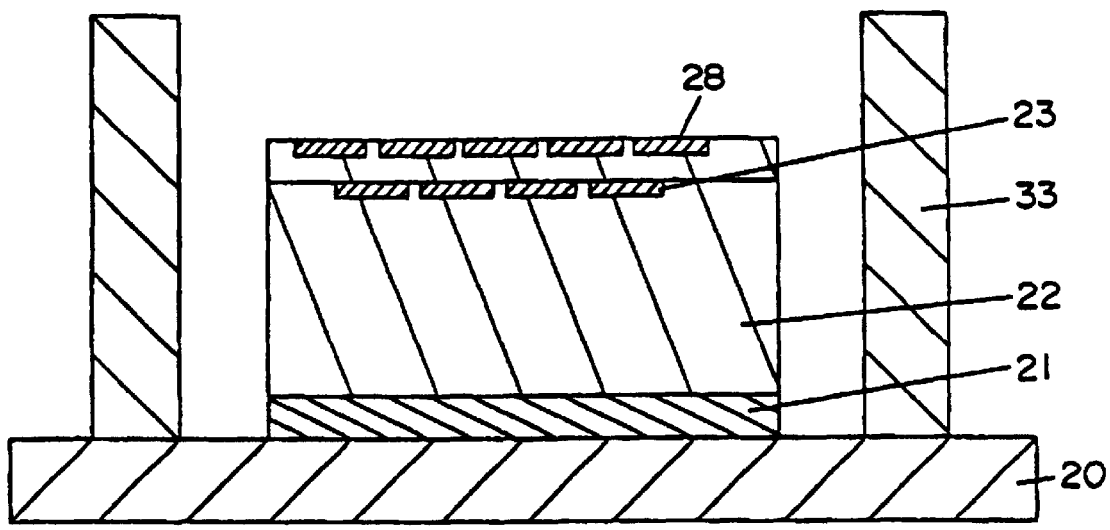

FIG. 12 is a drawing explanatory of a method for transferring a ceramic greenware sheet with electrode embedded therein by the use of a pressurization roller. In FIG. 12, the reference numeral 31 is the pressurization roller which is kept at a constant temperature by a heater 26a. When a ceramic greenware sheet 25 with electrodes embedded therein passes between the laminated body of ceramic greenware sheet 22 and the pressurization roller 31, the ceramic greenware sheet 25 with electrodes embedded therein is transferred onto the surface of the laminated body of ceramic greenware sheets 22 to become a transferred ceramic greenware sheet 30 with electrodes embedded therein. When this method is adopted, transfer of the ceramic greenware sheet with electrodes embedded therein can be performed continuously.

FIG. 13 through FIG. 17 are drawings explanatory of a process in which the positioning is carried out when a pin is used during lamination of the ceramic greenware sheets with electrodes embedded therein. In FIG. 13 through FIG. 17, the reference numeral 32 is a pin. Lamination with high accuracy is achieved by making a hole in the base film 21a which mates with the pin 32. This means that the base film used in the invention can be selected from those having a film thickness of 75 micrometers or higher dimensional accuracy in accordance with the production cost or the lamination accuracy requirements. Especially in the method of manufacturing laminated-ceramic electronic components of the invention, because ceramic greenware sheets with electrodes embedded therein are individually laminated for each base film, the pin 32 can be used in the positioning during lamination such as that shown in FIG. 13 through FIG. 17, and the lamination accuracy can be improved.

FIG. 18 through FIG. 25 are drawings explanatory of a process in which the positioning is carried out when a die is used during lamination of ceramic greenware sheets with electrodes embedded therein. In FIG. 18 through FIG. 25, the reference numeral 33 is a die. According to the invention, by laminating ceramic greenware sheets with electrodes embedded therein individually for each base film, the base film can be used in the positioning during lamination regardless of the thickness of the ceramic greenware sheets with electrodes embedded therein. Moreover, the base film used in the invention can be a film having a thickness of 75 micrometers as mentioned previously, or one of higher mechanical strength, whereby the positioning can be carried out during lamination with only the base film as shown in FIG. 22 through FIG. 25. For this reason, a clearance may be made between the die 33 and the laminated body of the ceramic greenware sheets 22 as shown in FIG. 22 through FIG. 25, which makes it easy to take out the laminated body of ceramic greenware sheets 22 from the die 33.

Figure 26:
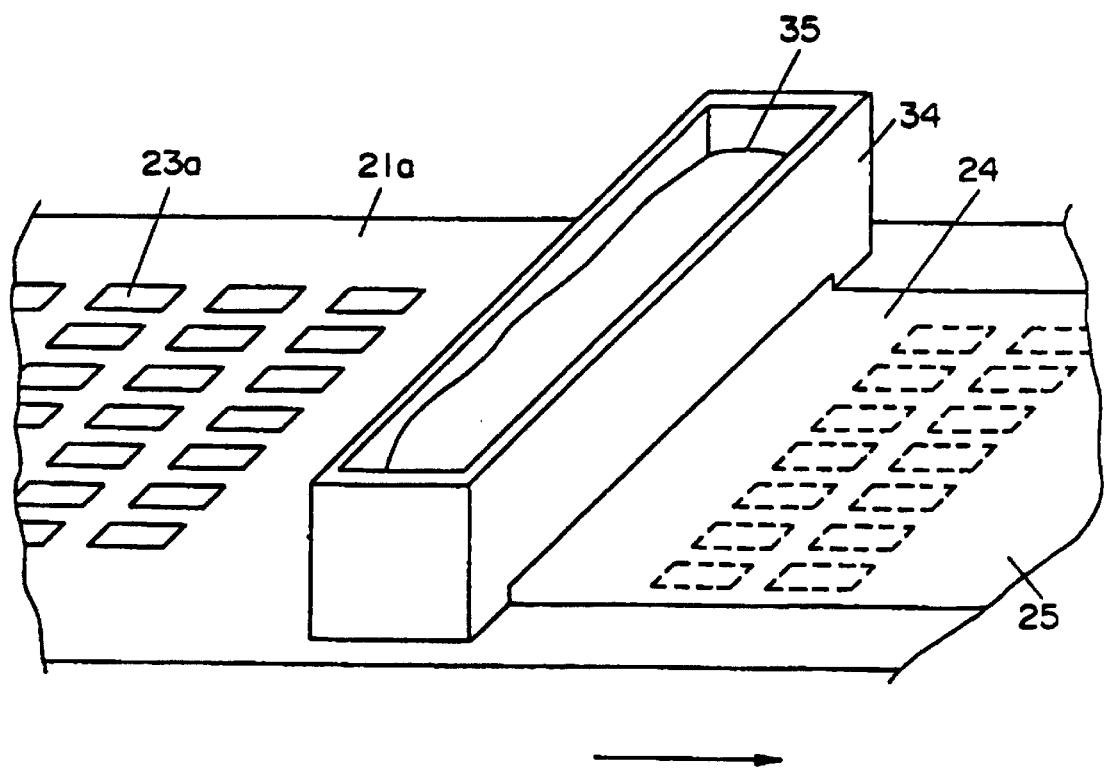
FIG. 26 is a drawing explanatory of an example of the method for manufacturing a ceramic greenware sheet with electrodes embedded therein.

FIG. 26 is a drawing explanatory of an example of the method for manufacturing ceramic greenware sheets with electrodes embedded therein. In FIG. 26, the reference numeral 34 is an applicator, 35 is ceramic slurry which is set in the applicator 34.

The arrow indicates the direction in which the base film 21a moves. In FIG. 26, the ceramic slurry 35 is applied by the applicator 34, in which the ceramic slurry 35 has been set, to the base film 21a on which the electrode 23a is formed in advance, resulting in a ceramic greenware sheet 25. The applicator 34 is preferably capable of forming a film of a thickness from 5 to 20 micrometers. The applicator 34 may be moved while keeping the base film 21a fixed.

A method for manufacturing ceramic greenware sheets with electrodes embedded therein is described below by the use of the ceramic slurry of the above-mentioned example, but by the use of other means than the applicator.

Figure 27:
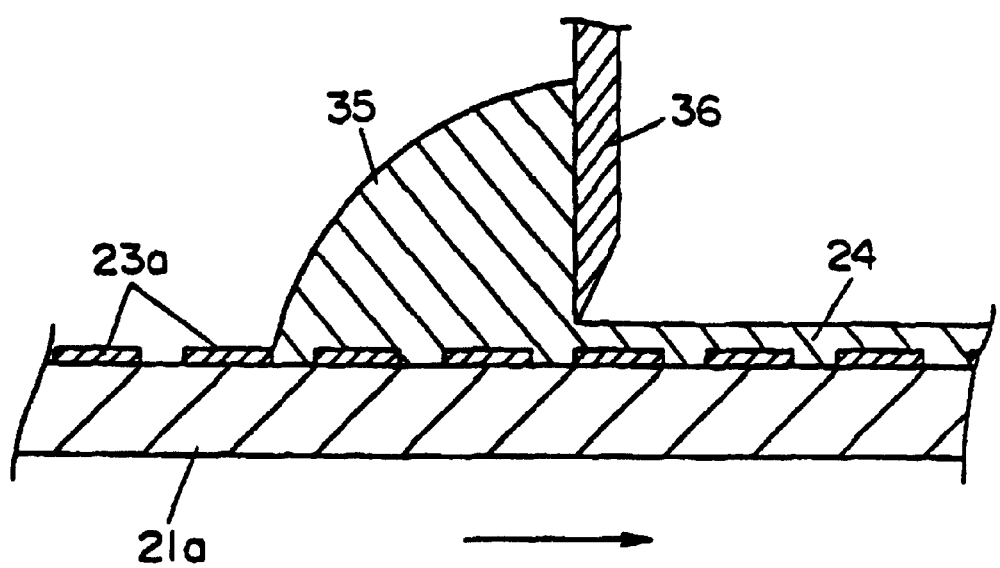
FIG. 27 is a drawing explanatory of a process for manufacturing a ceramic greenware sheet with electrodes embedded therein by the use of a doctor blade.

FIG. 27 is a drawing explanatory of a process for manufacturing ceramic greenware sheets with electrodes embedded therein by the use of a doctor blade. In FIG. 27, the reference numeral 36 is the doctor blade which is used to embed the electrode 23a, which is formed on the base film 21a, with the ceramic slurry 35. By the use of the doctor blade 36 instead of the applicator, the clearance between the doctor blade 36 and the bass film 21a or the clearance between the doctor blade 36 and the electrode 23a can be changed to adjust the coat thickness of the ceramic slurry 35 to a given value. Consequently, ceramic greenware sheets with electrodes embedded therein of less variation in the thickness of the sintered ceramic layer, and in the transferability, can be stably manufactured by adjusting the coat thickness by means of the doctor blade 36, in accordance with the variation of the ceramic slurry between the lots.

Figure 28:
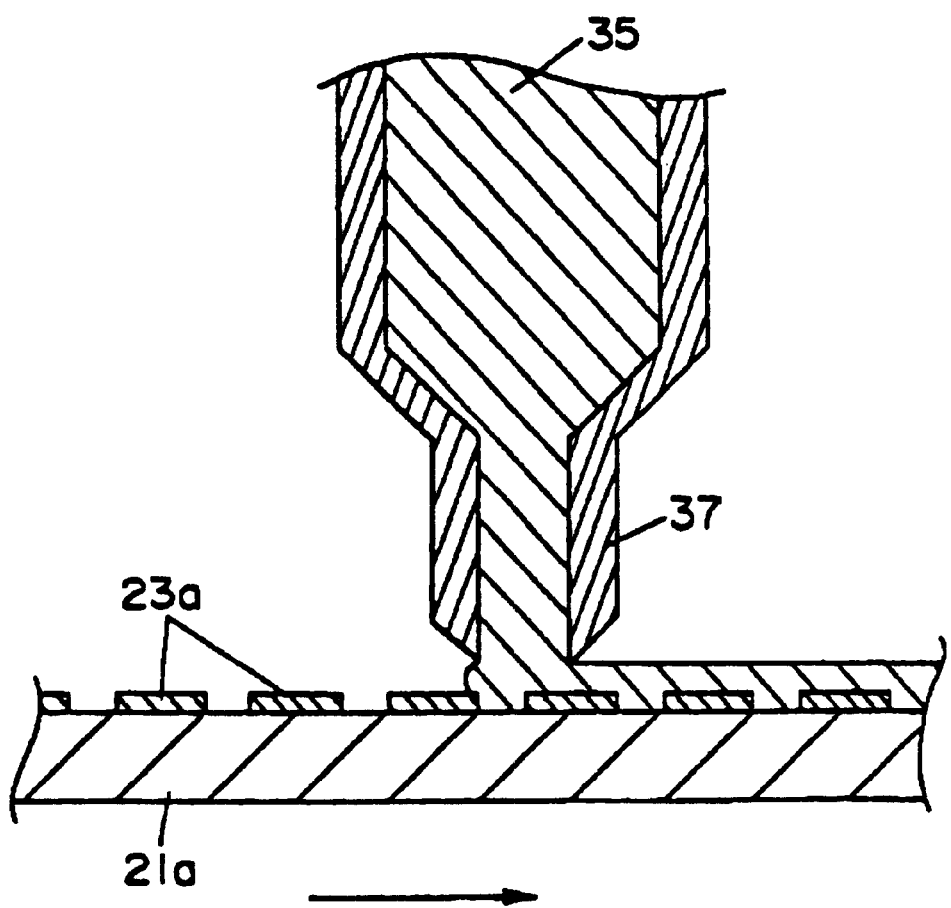
FIG. 28 is a drawing explanatory of a process for manufacturing a ceramic greenware sheet with electrodes embedded therein by the use of a pressure type applicator.

FIG. 28 is a drawing explanatory of a process for manufacturing ceramic greenware sheets with electrodes embedded therein by the use of a pressure type applicator. In FIG. 28, the reference numeral 37 is the pressure type applicator which is called a nozzle coater or a die coater. The tip of the pressure type applicator 37 is made into a nozzle-like or slit-like shape, and is filled with ceramic slurry 35 under pressure. As the base film 21a moves in the direction indicated by the arrow, the ceramic slurry 35 which fills the inside of the pressure type applicator 37 under pressure starts to flow and embed the electrode 23a. Moreover, a stable coating operation can be performed by continuously pressurizing the ceramic slurry 35 so as to fill the inside of the pressure type applicator 37 by means of a gear pump or a tube pump.

By using the pressure type applicator in such a way as described above, the amount of applied ceramic slurry can be stabilized and the supply thereof can be increased. By this method, the application rate of slurry, namely the rate of manufacturing ceramic greenware sheets with electrodes embedded therein, can be increased to over 10 times that of the case where the doctor blade or similar means is used.

In accordance with the invention, the transfer process may be performed by using light which includes infrared ray, electron beam, microwave, ultrasonic (ultrasonic heating included), X ray or the like. Transfer can also be performed at room temperatures by changing the kinds and quantities of PVB resin, the resin added thereto, and the plasticizer.

By adopting the method of manufacturing laminated-ceramic electronic components of the invention, it is made possible to manufacture, in addition to the laminated-ceramic capacitors of the above-mentioned example, multi-layer ceramic circuit substrates, laminated varistors, laminated-piezo-electric elements, or laminated-ceramic electronic components which are made by compounding some of these elements. The laminated-ceramic electronic components made by compounding mentioned here, refers to multi-layered ceramic circuit substrates which incorporate laminated-ceramic capacitors laminated varistors and the like thereinto, or laminated-ceramic electronic components or the like which have combined functions of the varistor and the capacitor. By equipping a single laminated-ceramic electronic component with multiple functions, laminated-ceramic electronic components can be made more compact with higher performance.

EXAMPLE 2

FIGS. 29(A), (B), (C) and (D) show a second example of the invention. This example is to stably manufacture the ceramic greenware sheets with electrodes embedded therein, each of which has a smoother surface than those of FIGS. 26 to 28.

In FIG. 29, the reference numeral 38 is the louver and 39 is the air flow control valve. A direction of the air flow of which flow rate has been controlled by the air flow control valve 39 is controlled by the louver 38. FIGS. 29(A), (B), (C), and (D) are explained successively in the following. In FIG. 29(A), a ceramic slurry 35 is applied onto the electrode 23a which is formed on the base film 21a. During this process, irregularities due to the electrode 23a are likely to occur on the surface of the ceramic slurry 35 as shown in FIG. 29(B). As shown in FIG. 29(C), the irregularities generated on the surface of the ceramic slurry 35 can be reduced by sending air flow in a direction regulated by the louver 38 with the flow rate regulated by the air flow rate control valve 39. Thus, as shown in FIG. 29(D), ceramic greenware sheets with electrodes embedded therein having a smooth surface can be obtained. The use of the louver 38 for the purpose of preventing the air flow from being directed toward the surface of the ceramic slurry 35 at right angles, which causes the air flow to be unable to find the exit, resulting in a remarkably lowered effect of the surface irregularity reduction.

The embodiment shown in FIG. 29 is described in more detailed below. The electrode ink, the ceramic slurry, the base film and others used here are the same as those used in Example 1 mentioned above.

The ceramic slurry was applied continuously to the base film 21*a* where the electrode 23*a* was formed by using an applicator. Then, the ceramic slurry coat was exposed to an air flow which was sent in an oblique direction to reduce the surface irregularities due to the electrode embedded in the surface of the ceramic slurry. The air flow was generated by a hair drier (available in the market) with output power of 1000 W, equipping it with an air flow rate control valve 39 and a louver 38 attached to the tip thereof. Ceramic greenware sheets with electrodes embedded therein manufactured in such a manner as described above, when measured with a micrometer, showed a thickness of 18 micrometers. For the purpose of comparison, spontaneously dried ceramic greenware sheets with electrodes embedded therein were manufactured under the rest of the conditions that is the same as the above. Table 6 shows the result of the measurement of the surface irregularities of both ceramic greenware sheets with electrodes embedded therein by means of a surface roughness meter of the contact probe type.

TABLE 6

|  | Surface irregularities (micrometers) |
| --- | --- |
| Irregularities of electrode on the base film only | 8–10 |
| Irregularities of spontaneously dried ceramic greenware sheet with electrodes embedded therein | 5–7 |
| Irregularities of ceramic greenware sheet with electrodes embedded therein of Example 2 | 3 or below |

It can be seen from the Table 6 that the occurrence of the surface irregularities on the surface of the ceramic greenware sheets with electrodes embedded therein can be remarkably reduced by drying with a louver. It was also observed, in an experiment where the louver angle was changed, that drying with air flow directed at right angles to the back of the ceramic greenware sheets with electrodes embedded therein leaves surface irregularities (around 5 to 7 micrometers) of a degree similar to the spontaneously dried product. It was found that the best effect was obtained when the louver angle was around 30 to 60 degrees with respect the ceramic greenware sheet surface.

Then, ceramic greenware sheets with electrodes embedded therein in accordance with Example 2 mentioned herein, were transferred in the same number of lamination as that in Example 1 under the same conditions so as to make a laminated body, which was then cut into chips similar to those in Example 1 and sintered under the same conditions, which were thereafter fitted with external electrodes in the same way.

Then, the short circuit occurrence rate and the delamination occurrence rate were investigated on samples of the products of Examples 1 and 2, each in a volume of 100 pieces, in the same way as that shown in Table 3. The results are shown in Table 7 below.

TABLE 7

| Manufacturing method | Short circuit occurrence rate (%) | Delamination occurrence rate (%) |
| --- | --- | --- |
| Example 1 | 5 | 3 |
| Example 2 | 3 | 1 |

As described above, a remarkable improvement was achieved in the delamination occurrence rate in particular, by reducing the surface irregularities of the ceramic greenware sheets with electrodes embedded therein in Example 2. This is supposed to be attributable to the improvement of the lamination stability of the laminated body resulting from more stable transfer which was obtained by smoothing the surface of the ceramic greenware sheets with electrodes embedded therein.

Figure 4:
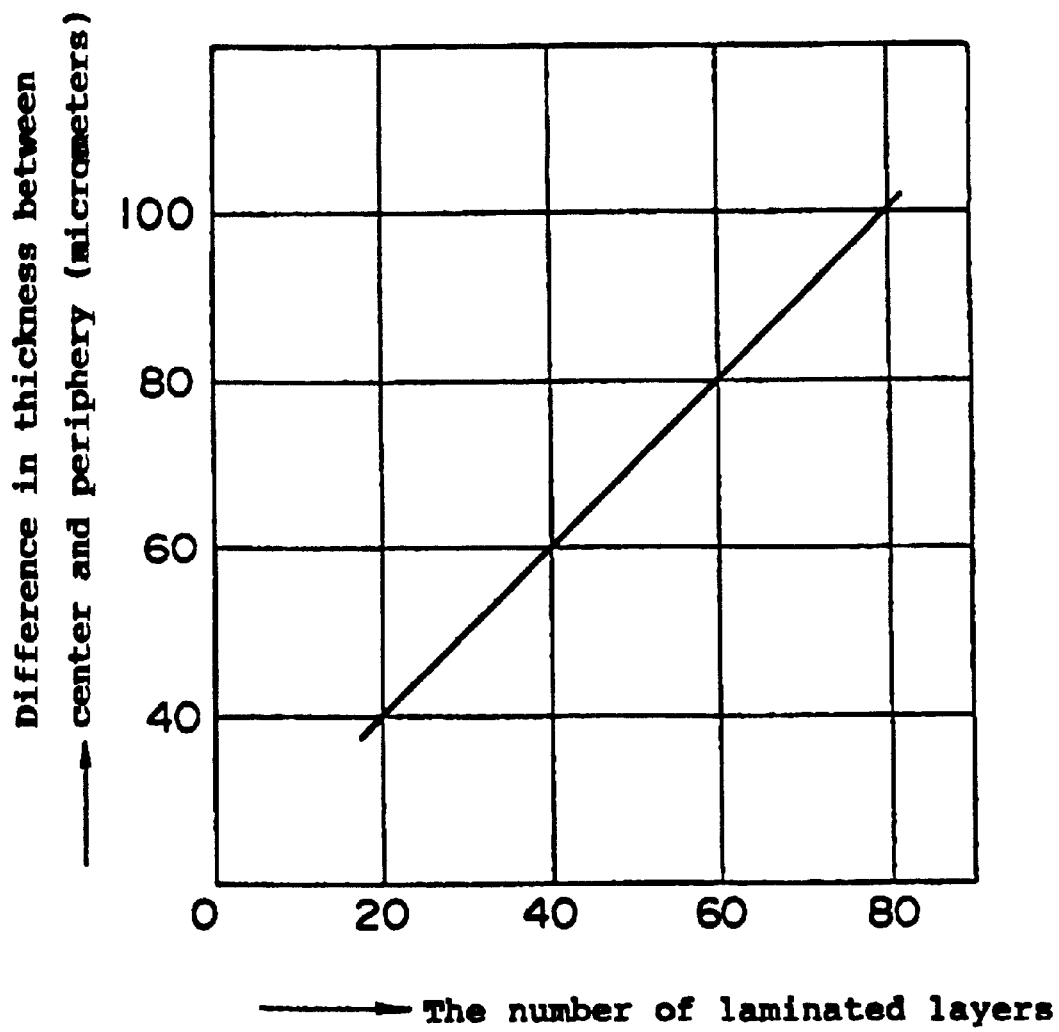
FIG. 4 is a drawing explanatory of the thickness difference between the center and the periphery of a laminated-ceramic capacitor with respect to the number of laminated layers.
Figure 5:
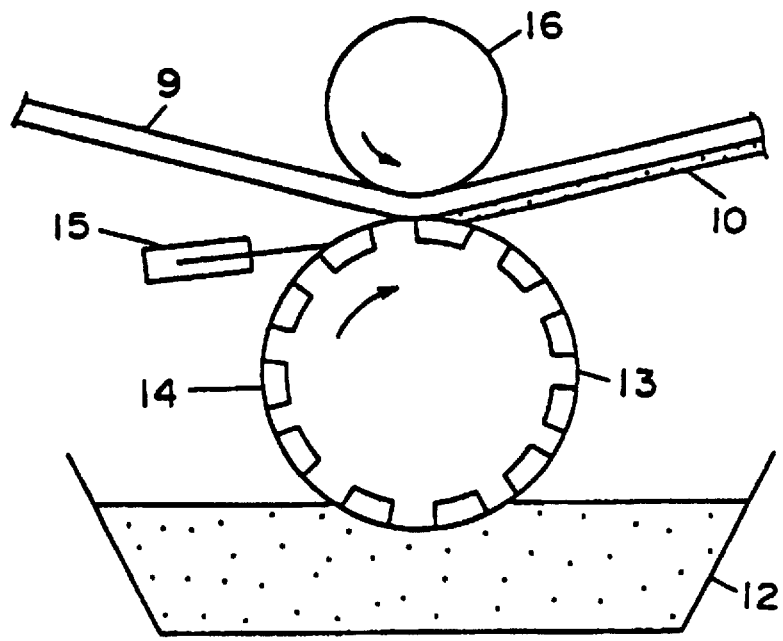
FIG. 5 is a drawing explanatory of a process for applying a ceramic slurry by using a gravure printing press.
Figure 6:
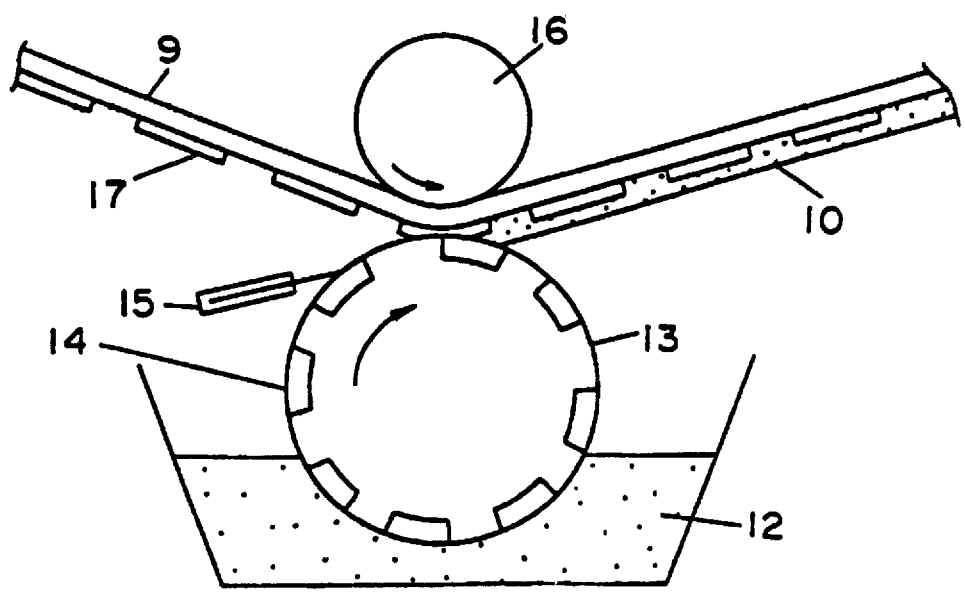
FIG. 6 is a drawing explanatory of a process for applying a ceramic slurry onto a base film, on which electrodes have been formed, by using a gravure printing press.
Figure 7:
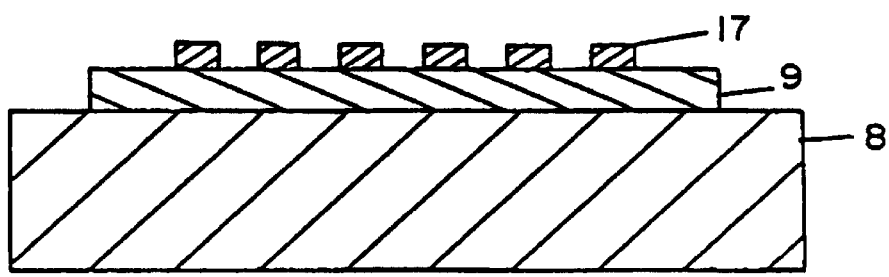
FIGS. 7(A), (B), and (C) are drawings explanatory of a process of irregularities being generated on the surface of a ceramic slurry due to the electrodes as the ceramic slurry is dried after embedding the electrodes in the ceramic slurry.
Figure 7:
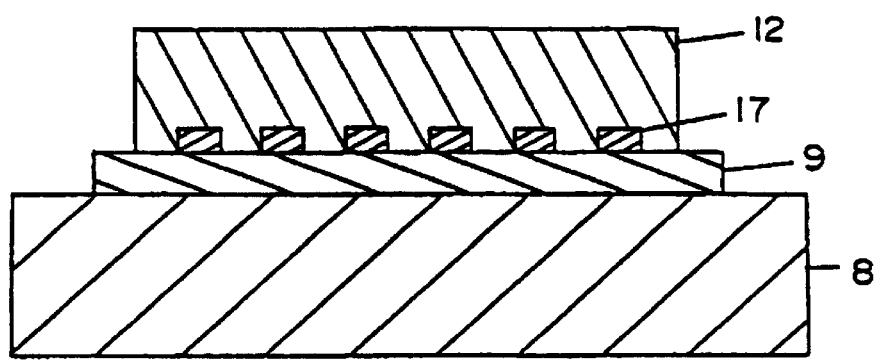
Figure 7:
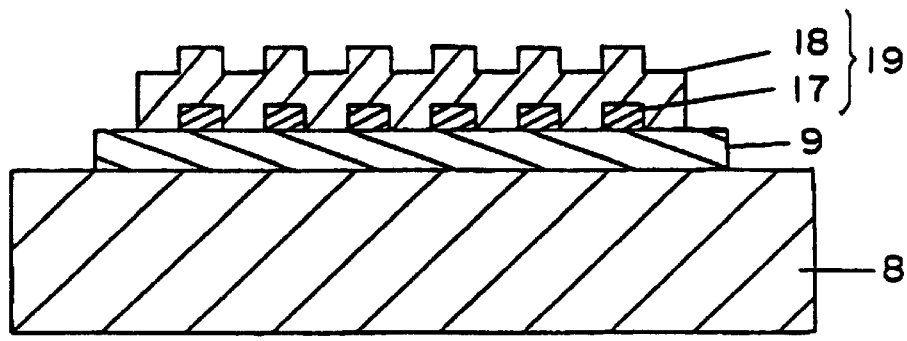

Then, by laminating the ceramic greenware sheets with electrodes embedded therein manufactured in the above process where the surface irregularities could be reduced, the number of laminated layers and the thickness difference (corresponding to FIG. 4) between the center and the periphery of the laminated body were measured. The measured thickness difference was as small as about 5 to 10 micrometers when the number of laminated layers in the ceramic greenware sheets with electrodes embedded therein was 51, and was about 7 to 15 micrometers when the number of laminated layers was 101. Thus, it can be seen that the surface irregularities of the ceramic greenware sheets with electrodes embedded therein cause almost no problem after lamination when they are restricted within about 3 micrometers.

EXAMPLE 3

FIGS. 30(A), (B), (C) and (D) show a third example of the invention. This example is to stably manufacture ceramic greenware sheets with electrodes embedded therein, each of which has a smoothed surface, in the same as that of Example 2.

Figure 30:
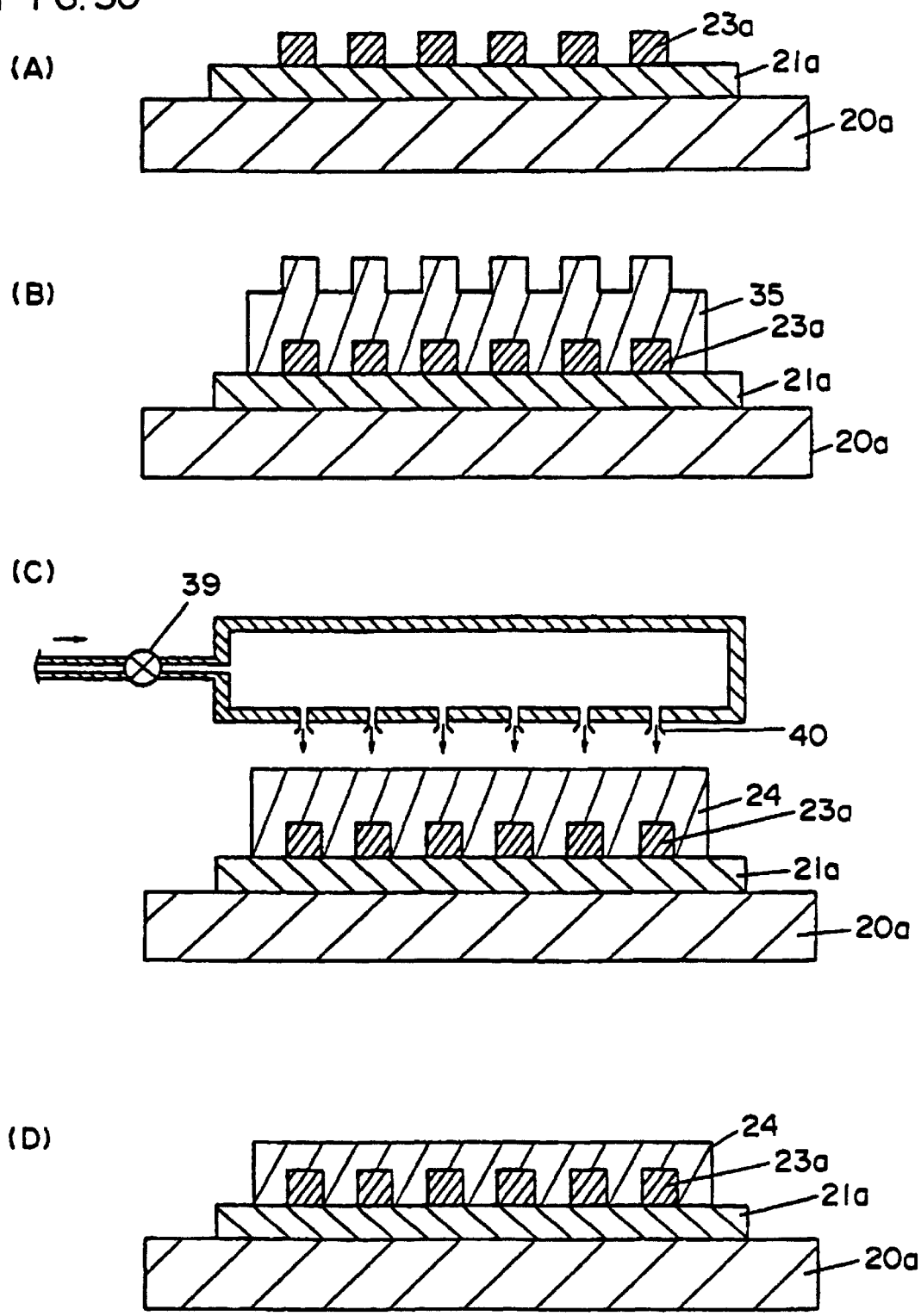
FIGS. 30(A) to (D) are drawings explanatory of the process for manufacturing a ceramic greenware sheet with electrodes embedded therein in a third example of the invention.

In FIGS. 30, the reference numeral 40 is the nozzle. Air flow with flow rate controlled by an air flow rate control valve 39 is regulated so that the air flow is locally received by the ceramic slurry 35 in which the electrode 23*a* is to be embedded.

The manufacturing process is explained in further detail in the following. The electrode ink, the ceramic slurry, the base film, and so on used herein were the same as those in Example 1 described above. The ceramic slurry 35 was continuously applied to the base film 21*a* where the electrode 23*a* had been formed by means of an applicator. Then, a portion of the ceramic slurry where the electrode 23*a* was formed was exposed to an air flow of a flow rate controlled by the air flow control valve 39 supplied from a plurality of nozzles 40 (1 mm in diameter and 5 mm in length), resulting in a product with the surface irregularities similar to those of the product dried with the louver shown in Table 6.

Then, the ceramic greenwere sheets with electrodes embedded therein in accordance with Example 3 were transferred in the same number of lamination as that in Example 1 under the same conditions so as to make a laminated body, which was then cut into similar chips and sintered under the same sintering conditions, and were thereafter fitted with external electrodes. Results obtained were similar to those shown in Table 7.

EXAMPLE 4

FIGS. 31(A) and (B) show a fourth example of the invention. This fourth example is to stably manufacture ceramic greenware sheets with electrodes embedded therein, each of which has a smoothed surface in the same way as Examples 2 and 3.

Figure 31:
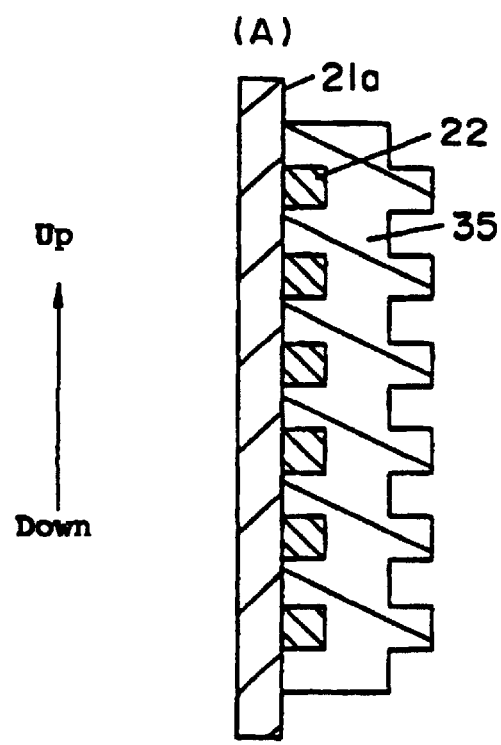
FIGS. 31(A) and (B) are drawings explanatory of the process for manufacturing a ceramic greenware sheet with electrodes embedded therein in a forth example of the invention.
Figure 31:
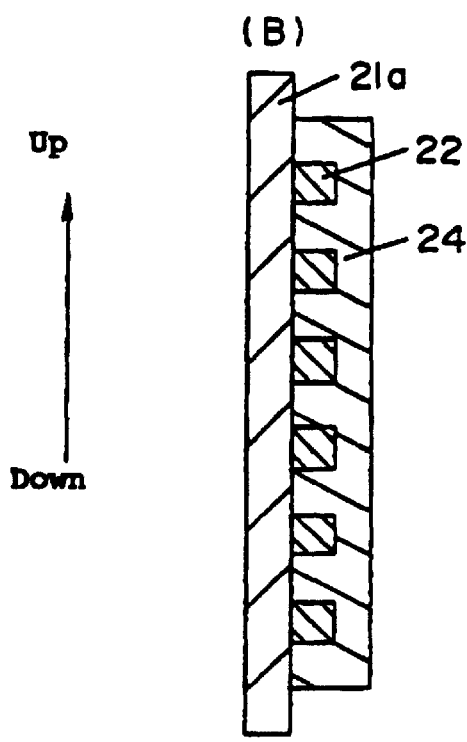
Figure 33:
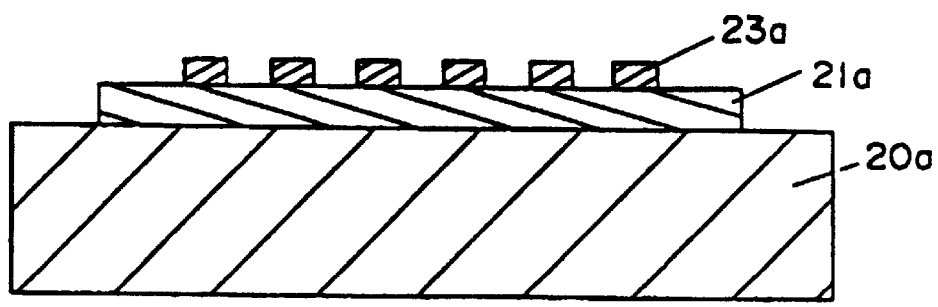
Figure 33:
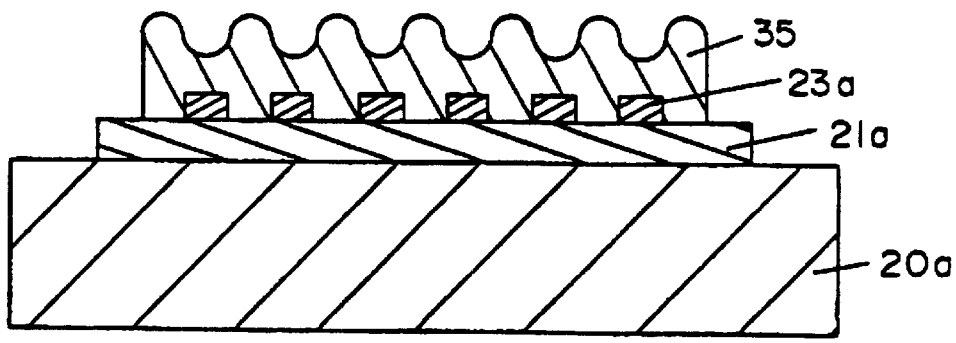
Figure 33:
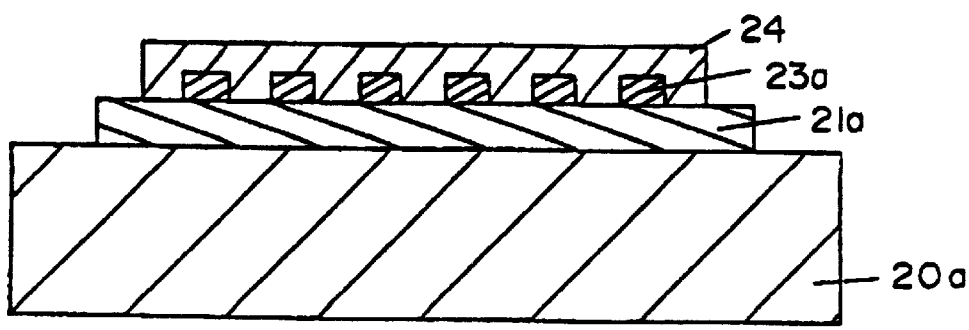

In FIGS. 31, a ceramic slurry 35 applied onto an electrode 23a which is formed on a base film 21a is effectively leveled by its own weight by placing the base film 21a in a perpendicular direction, resulting in a ceramic greenware sheet with electrodes embedded therein, which has a smooth surface with a stability.

The manufacturing process is explained in further detail in the following. The electrode ink, the ceramic slurry, the base film and other materials used herein were the same as those in Example 1.

The ceramic slurry 35 was continuously applied to the base film 21a where the electrode 23a had been formed by means of an applicator. Then, the base film 21a was placed vertically so that the ceramic slurry 25 which was applied onto the electrode 23a could be leveled by gravity. Ceramic greenware sheets with electrodes embedded therein manufactured in such a manner, when measured with a micrometer, showed a thickness of 18 micrometers. For the purpose of comparison, ceramic greenware sheets with electrodes embedded therein which were spontaneously dried on a level surface were manufactured (the same product as the spontaneously dried product in Table 6). Table 8 shows the results of the measurement of the surface irregularities of each of the ceramic greenware sheets with electrodes embedded therein by means of a surface roughness meter of contact probe type.

TABLE 8

|  | Surface irregularities (micrometers) |
|---|---|
| Irregularities of electrode on the base film only | 8–10 |
| Irregularities of spontaneously dried ceramic greenware sheet with electrodes embedded therein | 5–7 |
| Irregularities of ceramic greenware sheet with electrodes embedded therein of Example 4 | 3 or below |

From Table 8, it can be seen that this manufacturing method is more effective in the surface smoothness than the spontaneous drying method. Results obtained after sintering were similar to those shown in Table 7.

As described above, when ceramic greenware sheets with electrodes embedded therein are manufactured by using a ceramic slurry of, for example, poor leveling characteristics, the surface thereof can be effectively smoothed by setting the base film perpendicularly. The setting angle was changed after applying the ceramic slurry thereto and the smoothing effect was stably obtained at the time when the angle was fixed to be within about ±30 degrees from the perpendicular position.

Also, in accordance with the invention, excellent transfer characteristics can be obtained because the transferred surface of the ceramic greenware sheets with electrodes embedded therein functions as a peeling-off surface (smooth surface) of a ceramic greenware sheet with electrodes embedded therein acting as a base film which was transferred beforehand.

Also, the thinner the embedded electrodes, the more advantageous for the smoothing of the surface of the ceramic greenware sheets with electrodes embedded therein.

EXAMPLE 5

FIGS. 32 to 35 show a fifth example of the invention. The fifth example is to stably manufacture ceramic greenware sheets with electrodes embedded therein, each of which has a smooth surface in the same way as those of Examples 2–4.

Figure 34:
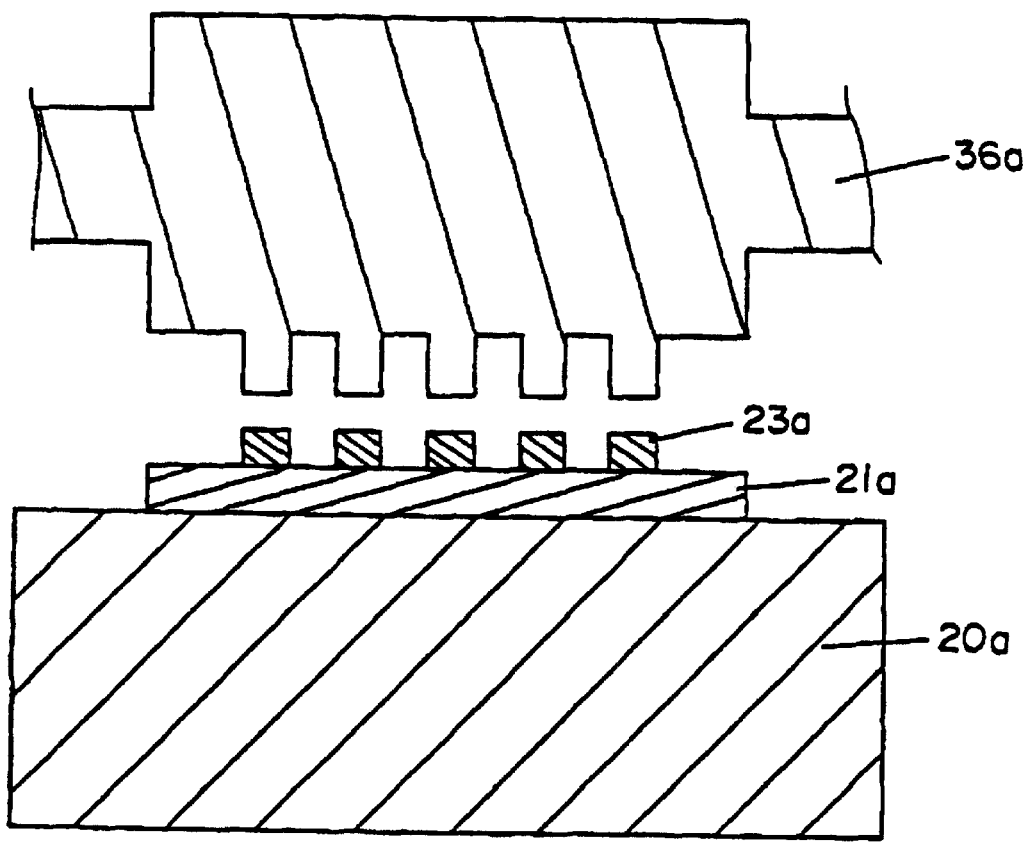
Figure 35:
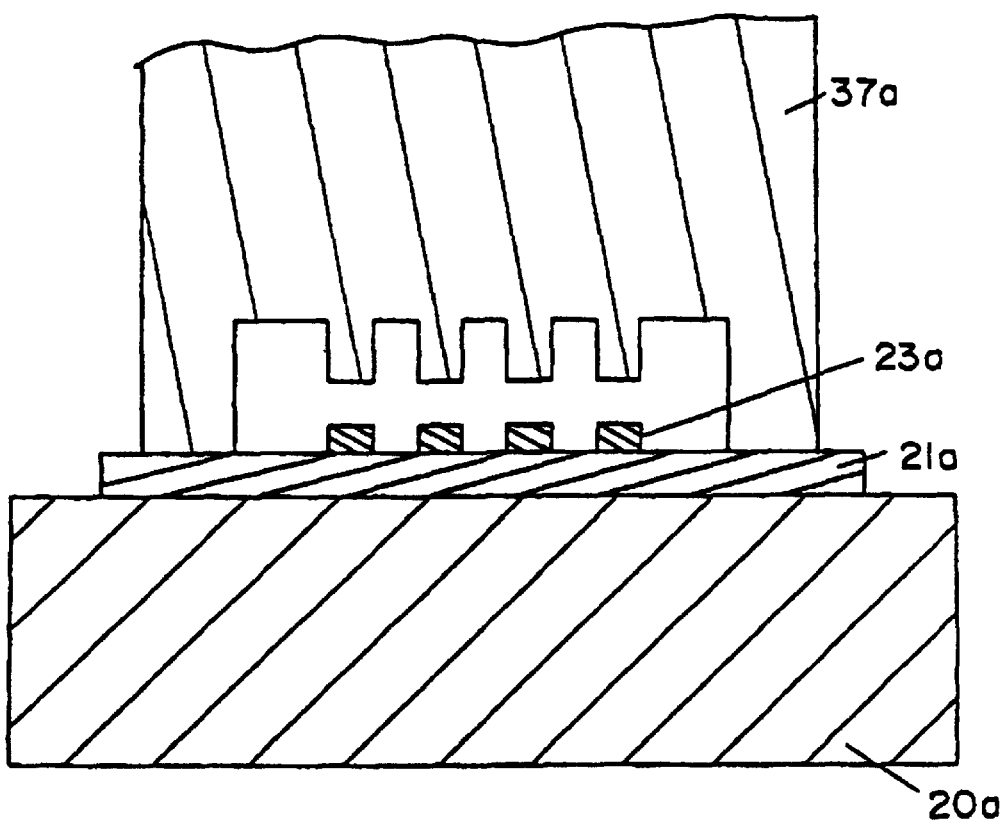

In FIG. 32, an applicator 34a has regular unevenness on the coating section. FIGS. 33(A), (B), and (C) are drawings in view of the direction indicated by arrow C of FIG. 32. Because the applicator 34a has a regular unevenness on the coating section, the ceramic slurry 35 applied onto the electrode 23a is formed into the shape as shown in FIG. 33(B), and then dried, resulting in a ceramic greenware sheet with electrodes embedded therein, the surface of which is smoothed as shown in FIG. 33(C). Ceramic greenware sheets with electrodes embedded therein, which have smooth surfaces, can be also manufactured by providing unevenness on the coating surface of the doctor blade 36a as shown in FIG. 34, or by providing unevenness on the coating surface of the pressure type applicator 37a as shown in FIG. 35. This adjusts the unevenness of the surface to be coated depending upon the thickness of the electrode formed on the base film, so that a ceramic greenware sheet with electrodes embedded therein which have a smooth surface can be stably obtained.

EXAMPLE 6

Figure 36:
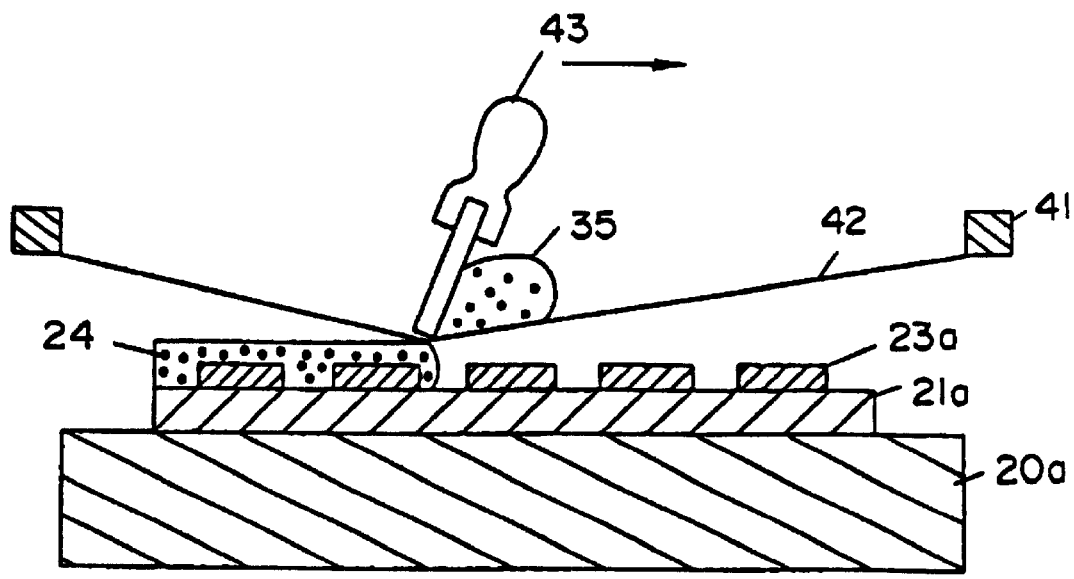
FIG. 36 are drawings explanatory of the process for manufacturing a ceramic greenware sheet with electrodes embedded therein in a sixth example of the invention.

FIG. 36 shows a sixth example of the invention. This example is to manufacture ceramic greenware sheets with electrodes embedded therein by a screen printing technique. In FIG. 36, the reference numeral 41 is the screen frame, 42 is the screen and 43 is the squeegee. A ceramic slurry 35 is applied by a squeegee 43 to a base film 21a, where the electrode 23a is formed, so as to cover the entire surface of the electrode 23a. Particularly, by not forming an emulsion layer on the screen 42 used in this example, the electrode 23a which is formed on the base film 21a works as a kind of emulsion layer, enabling to reduce the quantity of ceramic slurry which is transferred onto the electrode 23a, compared to that on the base film 21a.

A preparation of the ceramic slurry used in the screen printing process is described below. First of all, 10 parts by weight of a binder resin which is mainly composed of PVB resin was added to a mixture of 23 parts by weight of a solvent which is mainly composed of diethylene glycol monobutyl ether and 3 parts by weight of plasticizer which is mainly composed of dibutyl phthalate. After the binder resin was well-dissolved thereinto, 64 parts by weight of barium titanate powder with a particle size of about 1 micrometer was added to the mixture, which was then well kneaded by the use of three roll mills made of ceramic, resulting in a ceramic slurry for use in a screen printing (called a slurry for screen hereafter).

Then, the slurry for screen was printed on the entire surface of a base film which includes a plurality of electrodes, by means of a screen printing technique, by the use of a stainless steel screen of 400 mesh (in which no emulsion layer is formed). A printing of the slurry for the screen was carried out by, first, printing the slurry for screen all over the surface and drying it by the use of a drier of warm air circulation type, then printing the slurry for the screen all over the surface once again and drying it, to thereby make a ceramic greenware sheet with electrodes embedded therein. The ceramic greenware sheet of the ceramic greenware sheet with electrode embedded therein was measured using a micrometer, showing a thickness of 16 micrometers. By laminating ceramic greenware sheets in two layers (or two-fold), occurrence of pin holes during a screen printing process can be prevented.

The thickness of the ceramic greenware sheet can be also adjusted by changing the screen (the material, the method of weaving, the void ratio, the number of mesh, etc., of the screen) used in the printing of the slurry for screen.

Then, the ceramic greenware sheets with electrodes embedded therein in accordance with Example 6 were transferred in the same number of lamination as that in Example 1 under the same conditions so as to make a laminated body, which was cut into similar chips and sintered under the same sintering conditions, and were thereafter fitted with external electrodes, resulting in products.

Then, the short circuit occurrence rate and the delamination occurrence rate were investigated on 100 samples of the products of Example 6 in the same way as the case shown in Table 3. The results are shown in Table 9 below.

TABLE 9

| Manufacturing method | Short circuit occurrence rate (%) | Delamination occurrence rate (%) |
|---|---|---|
| Example 6 | 2 | 1 |

Table 10 shows the results of a measurement of the surface irregularities of the ceramic greenware sheets with electrodes embedded therein, which were made in Example 6, by means of a surface roughness meter of contact probe type.

TABLE 10

| | Surface irregularities (micrometers) |
|---|---|
| Irregularities of electrode on the base film only | 8–10 |
| Irregularities of Example 6 | 3 or below |

As shown above, Example 6 reduces both the short circuit occurrence rate and the delamination occurrence rate. Ceramic greenware sheets, the delamination occurrence rate of which is within about 3%, can be further improved to have a delamination occurrence rate of almost 0 by optimizing the sintering time.

The short circuit occurrence rate can be also greatly improved by improving the cleanliness of the working environment.

By adopting a rotary screen printing process for the screen printing technique, ceramic greenware sheets with electrodes embedded therein can be continuously manufactured at a speed of several tens of meters per minute. The adoption of a rotary screen process also enables the use solvents of lower boiling points in the manufacture of the slurry for screen and to increase the drying speed and the application speed.

The adoption of a screen printing technique in the manufacture of ceramic greenware sheets with electrodes embedded therein enables the increase in the viscosity of the ceramic slurry up to several hundreds of poise, which results in a reduction of the solvent content included in the ceramic slurry. Consequently the difference between the thickness of a ceramic slurry immediately after coated and the thickness of a dried ceramic greenware sheet can be reduced, making it possible to manufacture ceramic greenware sheets with electrodes embedded therein with good reproducibility.

EXAMPLE 7

Figure 37:
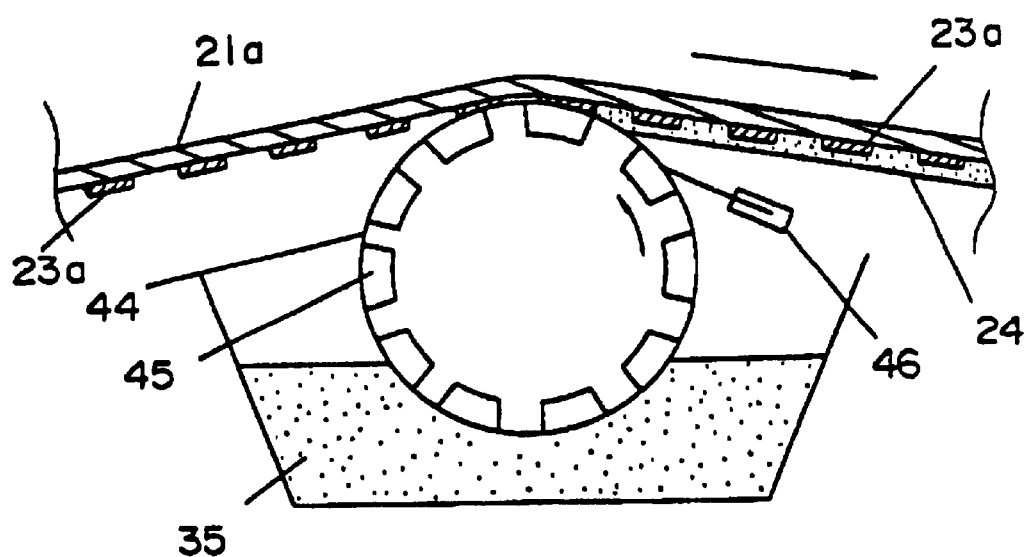
FIG. 37 are drawings explanatory of the process for manufacturing a ceramic greenware sheet with electrodes embedded therein in a seventh example of the invention.

FIG. 37 shows a seventh example of the invention. This example is to manufacture ceramic greenware sheets with electrodes embedded therein at a high production rate without damaging electrodes formed on a base film. In FIG. 37, the reference numeral 44 is the gravure plate, 45 is the cell and 46 is the doctor. As shown in FIG. 37, ceramic greenware sheets with electrodes embedded therein are manufactured by means of a gravure printing press which does not use an impression cylinder. In Example 7, the base film 21*a* with electrodes 23*a* formed thereon and the gravure plate 44 can be moved in opposite directions because an impression cylinder is not used. Thus a trace of the cell 45 which has been formed on the gravure plate 44 by an etching technique or the like can be erased.

Example 7 is explained in detail below. The some ceramic slurry as that of Example 1 was used, and ceramic greenware sheets with electrodes embedded therein were manufactured using a commercially available gravure printing press (equipped with an impression cylinder) from which the impression cylinder was removed and modified to enable to freely change the rotation speed and the rotating direction of the gravure plate 44 (called the modified gravure printing press hereafter). The gravure plate which was used had a diameter of 2 cm and the cell 45 was spirally disposed around the gravure plate 44. The coating speed of the modified gravure printing press was set at 10 m/min. By adjusting the tension of the base film 21*a* and the rotation speed of the gravure plate 44, a stable manufacture of ceramic greenware sheets with electrodes embedded therein could be achieved while the film thickness thereof is being adjusted. The thickness of the ceramic greenware sheets with electrodes embedded therein which were manufactured in such a manner as described above was 16 micrometers. Table 11 below shows the results of a measurement of the surface irregularities of the ceramic greenware sheets with electrodes embedded therein of this example by means of a surface roughness meter of probe contact type.

TABLE 11

| | Surface irregularities (micrometers) |
|---|---|
| Irregularities of electrode on the | 8–10 |

TABLE 11-continued

| | Surface irregularities (micrometers) |
|---|---|
| base film only Irregularities of Example 7 | 3 or below |

Then, ceramic greenware sheets with electrodes embedded therein of Example 7 were transferred in the same number of laminations as that in Example 1 under the same conditions so as to make a laminated body, which was then cut into similar chips and sintered under the same sintering conditions and were fitted with external electrodes, resulting in a superior product.

Then, the short circuit occurrence rate and the delamination occurrence rate were investigated on 100 samples of the products of Example 7, in the same way as the case shown in Table 3. The results are shown in Table 12 below. Because it is known that a gravure printing with an impression cylinder is likely to cause breakage of the internal electrodes, the breakage occurrence rate of the internal electrodes was also measured as a reference, but no breakage was found.

TABLE 12

| Manufacturing method | Short circuit occurrence rate (%) | Delamination occurrence rate (%) |
|---|---|---|
| Example 7 | 3 | 2 |

The manufacture of ceramic greenware sheets with electrodes embedded therein by means of a gravure printing press without using an impression cylinder as described in Example 7, in particular, enables to move (rotate) the gravure plate 44 and the base film 21a in the opposite directions as described previously. At this time, the amount of the ceramic slurry applied can be adjusted by changing the rotation speed of the gravure plate 44. By such a way, a variation of the ceramic slurry from lot to lot can be restricted by changing the rotation speed of the gravure plate 44 and other conditions, thereby enabling the stable manufacture of ceramic greenware sheets with electrodes embedded therein.

EXAMPLE 8

Laminated varistors were manufactured by a method for manufacturing laminated-ceramic electronic components of the invention. First, the process for preparing a ceramic slurry for use in the laminated varistors is explained in the following. A ceramic slurry was prepared in the same way as that of Example 1 mentioned above. For the ceramic powder, varistor powder having a particle size of about 1 micrometer which includes ZnO as the major component was used instead of barium titanate.

Then, ceramic greenware sheets with electrodes embedded therein were manufactured in the same way as that of Example 1, which were then laminated, cut and sintered in the same way as that of Example 1, resulting in a laminated varistor which is to be the varistor of the invention.

In the same way as that of Example 1, a laminated varistor was also manufactured by a conventional method, resulting in a conventional varistor.

After attaching the specified external electrodes to the varistors of the invention and the conventional varistors, the short circuit occurrence rate and the delamination occurrence rate of both products were investigated on 100 samples each of the varistors of the invention and the conventional varistors of the prior art, in the same way as that of Table 3. The results are shown in Table 13 below.

TABLE 13

| | Short circuit occurrence rate (%) | Delamination occurrence rate (%) |
|---|---|---|
| The invention varistors | 6 | 4 |
| Conventional varistors | 97 | 100 |

As shown above, the short circuit occurrence rate and the delamination occurrence rate are greatly improved over the prior art by adopting the method for manufacturing laminated-ceramic electronic components of the invention. By the use of the method for manufacturing laminated-ceramic electronic components of the invention, laminated-piezoelectric elements and multi-layered ceramic circuit substrates as well as the laminated-ceramic capacitors and laminated varistors can be manufactured, as described previously. Moreover, compounds of these laminated-ceramic electronic components, i.e., multi-layered ceramic circuit substrates which incorporate laminated-ceramic capacitors, laminated varistors, or the like, or those which have the functions of both varistors and capacitors combined can also be manufactured.

Applicability to the Industry

As described above, by adopting the method for manufacturing laminated-ceramic electronics components of the invention, it is made possible to handle ceramic greenware sheets while the electrodes are embedded therein together with a support (base film), so that the problem of a decrease in mechanical strength due to the thinness of the ceramic greenware sheets and the handling problems related thereto can be solved. Moreover, because electrodes are embedded in the ceramic greenware sheets, the problem of the likeliness of a short circuit occurrence due to the penetration of electrode ink can also be solved even when the thickness of the ceramic greenware sheets is reduced. Besides, by smoothing the surface of each ceramic greenware sheet in which electrodes have been embedded, a variation of the thickness of lamination due to the presence or absence of the electrodes can be prevented even when the number of laminated layers is increased, which makes it possible to easily increase the number of laminated layers in the laminated-ceramic electronic components.

What is claimed is:

1. A method for manufacturing laminated-ceramic electronic components, comprising the steps of:
   a. forming a first plurality of electrodes on a first support;
   b. forming, on the first support, a first ceramic greenware sheet with the first plurality of electrodes embedded therein by applying a ceramic slurry onto the first plurality of electrodes;
   c. laminating the first ceramic greenware sheet in contact with a surface of a second ceramic greenware sheet by pressing the first ceramic greenware sheet via the first support and heating the first ceramic greenware sheet;
   d. peeling off the first support from the first ceramic greenware sheet being laminated;

e. forming a second plurality of electrodes on a second support;

f. forming, on the second support, a third ceramic greenware sheet with the second plurality of electrodes embedded therein by applying a ceramic slurry onto the second plurality of electrodes;

g. laminating the third ceramic greenware sheet in contact with a surface of the first greenware sheet from which the first support has been peeled off by pressing the third ceramic greenware sheet via the second support and heating the third ceramic greenware sheet to form a ceramic laminated structure having the second support;

h. peeling off the second support from the ceramic laminated structure; and i. sintering the ceramic laminated structure.

2. A method for manufacturing laminated-ceramic electronic components according to claim 1, wherein the ceramic greenware sheet with electrodes embedded therein is smoothed on its surface.

3. A method for manufacturing laminated-ceramic electronic components according to claim 2, wherein the smoothness of the surface of the ceramic greenware sheet with electrodes embedded therein is achieved by blowing off air, in a direction not perpendicular to the surface of the ceramic slurry, onto the ceramic slurry which has been applied onto the electrodes.

4. A method for manufacturing laminated-ceramic electronic components according to claim 2, wherein the smoothness of the surface of the ceramic greenware sheet with electrodes embedded therein is achieved by slanting the ceramic slurry, which has been applied onto the electrodes, together with the support.

5. A method for manufacturing laminated-ceramic electronic components according to claim 2, wherein the smoothness of the surface of the ceramic greenware sheet with electrodes embedded therein is achieved by applying a ceramic slurry onto the electrodes by means of a doctor blade or an applicator which has regular unevenness on the application surface thereof.

6. A method for manufacturing laminated-ceramic electronic components according to claim 1, wherein the laminated-ceramic electronic components mean laminated-ceramic capacitors, multi-layered ceramic circuit substrates, laminated varistors or laminated-piezoelectric elements, or compounds thereof.

7. A method for manufacturing laminated-ceramic electronic components according to claim 1, wherein the ceramic greenware sheet with electrodes embedded therein contains a thermoplastic resin in the range of 10 to 40% by weight.

8. A method for manufacturing a laminated-ceramic capacitor, comprising the steps of:

a. forming a first plurality of electrodes on a first support;

b. forming, on the first support, a first ceramic greenware sheet with the first plurality of electrodes embedded therein by applying a ceramic slurry onto the first plurality of electrodes, the first ceramic greenware sheet having a thickness of 20 micrometers or less;

c. laminating the first ceramic greenware sheet in contact with a surface of a second greenware sheet by pressing the first ceramic greenware sheet via the first support and heating the first ceramic greenware sheet;

d. peeling off the first support from the first ceramic greenware sheet being laminated;

e. forming a second plurality of electrodes on a second support;

f. forming, on the second support, a third ceramic greenware sheet with the second plurality of electrodes embedded therein by applying a ceramic slurry onto the second plurality of electrodes;

g. laminating the third ceramic greenware sheet in contact with a surface of the first ceramic greenware sheet from which the first support has been peeled off by pressing the third ceramic greenware sheet via the second support and heating the third ceramic greenware sheet to form a ceramic laminated structure having the second support;

h. peeling off the second support from the ceramic laminated structure; and i. sintering the laminated structure.

9. A method for manufacturing a laminated-ceramic capacitor according to claim 8, wherein the ceramic greenware sheet with electrodes embedded therein is smoothed on its surface.

10. A method for manufacturing a laminated-ceramic capacitor according to claim 9, wherein the smoothness of the surface of the ceramic greenware sheet with electrodes embedded therein is achieved by blowing air in a direction not perpendicular to the surface of the ceramic slurry, onto the ceramic slurry which has been applied onto the electrodes.

11. A method for manufacturing a laminated-ceramic capacitor according to claim 9, wherein the smoothness of the surface of the ceramic greenware sheet with electrodes embedded therein is achieved by slanting the ceramic slurry applied onto the electrodes together with the support.

12. A method for manufacturing a laminated-ceramic capacitor according to claim 9, wherein the smoothness of the surface of the ceramic greenware sheet with electrodes embedded therein is achieved by applying a ceramic slurry onto the electrodes by a doctor blade or an applicator which has regular unevenness on the coating surface thereof.

13. A method for manufacturing a laminated-ceramic capacitor according to claim 8, wherein the ceramic greenware sheet with electrodes embedded therein contains a thermoplastic resin in an amount of about 10 to about 40 percent by weight.

* * * * *

UNITED STATES PATENT AND TRADEMARK OFFICE
CERTIFICATE OF CORRECTION

PATENT NO.      : 6,485,591 B1
DATED           : November 26, 2002
INVENTOR(S)     : Keiichi Nakao et al.

It is certified that error appears in the above-identified patent and that said Letters Patent is hereby corrected as shown below:

<u>Title page,</u>
Item [63], Related U.S. Application Data, "PCT/JP99/00240" should read -- PCT/JP89/00240 --.

Signed and Sealed this

Seventeenth Day of June, 2003

JAMES E. ROGAN
*Director of the United States Patent and Trademark Office*